United States Patent
Yamada et al.

(10) Patent No.: US 6,737,118 B2
(45) Date of Patent: May 18, 2004

(54) LOW DIELECTRIC CONSTANT MATERIALS AND THEIR PRODUCTION AND USE

(75) Inventors: Noriko Yamada, Futtsu (JP); Toru Takahashi, Futtsu (JP); Tadashi Sakon, Futtsu (JP); Yoichi Matsuzaki, Futtsu (JP); Atsushi Nogami, Futtsu (JP); Shingo Katayama, Futtsu (JP); Ikuko Shiina, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 26 days.

(21) Appl. No.: 10/121,381

(22) Filed: Apr. 12, 2002

(65) Prior Publication Data

US 2002/0156180 A1 Oct. 24, 2002

Related U.S. Application Data

(63) Continuation-in-part of application No. 09/424,583, filed as application No. PCT/JP98/02367 on May 28, 1998, now Pat. No. 6,589,644.

(30) Foreign Application Priority Data

May 28, 1997 (JP) ............................................ 9-138690
Jul. 2, 1997 (JP) ............................................ 9/177261
Sep. 4, 1997 (JP) ............................................ 9-239747
Jan. 21, 1998 (JP) ............................................ 10-9550

(51) Int. Cl.$^7$ ........................... B05D 3/02; C08L 83/04; C07F 7/02
(52) U.S. Cl. ...................... 427/379; 427/245; 427/380; 427/387; 106/287.16; 524/858; 556/465; 556/466; 556/482; 556/484; 528/10
(58) Field of Search ................................ 427/245, 379, 427/380, 387; 524/858, 10; 556/465, 466, 482, 484; 106/287.13, 287.14, 287.16, 287.18, 287.19

(56) References Cited

U.S. PATENT DOCUMENTS

| 3,956,104 A | | 5/1976 | Hilfman et al. |
| 4,072,796 A | * | 2/1978 | Reinhardt et al. ........... 428/405 |
| 4,325,808 A | | 4/1982 | Kim et al. |
| 4,435,219 A | * | 3/1984 | Greigger ................. 106/287.16 |
| 4,716,048 A | * | 12/1987 | Ishihara et al. .............. 427/568 |
| 4,865,649 A | * | 9/1989 | Kashiwagi et al. ..... 106/287.16 |
| 5,321,102 A | | 6/1994 | Loy et al. |
| 5,362,521 A | * | 11/1994 | Ozaki et al. .............. 427/407.1 |
| 5,366,768 A | * | 11/1994 | Kasari et al. ............. 427/407.1 |
| 5,470,802 A | | 11/1995 | Gnade et al. |
| 5,504,042 A | | 4/1996 | Cho et al. |
| 5,820,923 A | * | 10/1998 | Ballance et al. .......... 427/126.2 |
| 6,214,104 B1 | * | 4/2001 | Iida et al. ............... 106/287.13 |

FOREIGN PATENT DOCUMENTS

| JP | 64-9231 | 1/1989 |
| JP | 3-221577 | 9/1991 |
| JP | 4-180977 | 6/1992 |
| JP | 6-206784 | 7/1994 |
| JP | 6-346025 | 12/1994 |
| JP | 7-166132 | 6/1995 |

OTHER PUBLICATIONS

English Translation of JP 06–346025, Yamaho et al. Dec.–1994, obtained from JPO website.*

* cited by examiner

Primary Examiner—Daniel S. Metzmaier
Assistant Examiner—Jeffrey B. Robertson
(74) Attorney, Agent, or Firm—Kenyon & Kenyon

(57) ABSTRACT

Silica-based low dielectric constant materials having three-dimensional network structures containing siloxane backbones which comprise $SiO_4$ tetrahedron structural units, as well as their production and use. The materials can be applied as interlayer dielectrics for semiconductor elements and the like.

8 Claims, 7 Drawing Sheets

○ O
● Si

⬭ ORGANIC GROUP
○ O
● Si

←——— 2 nm ———→

MOLECULAR STRUCTURE (1)

MOLECULAR STRUCTURE (2)

MOLECULAR STRUCTURE (3)

(a)  (b)

(a)

(b)

(c)

(d)

(e)

(f)

LOW DIELECTRIC CONSTANT MATERIALS AND THEIR PRODUCTION AND USE

CROSS REFERENCE TO RELATED APPLICATION

This application is a continuation-in-part of U.S. patent application Ser. No. 09/424,583 filed Nov. 24, 1999, now U.S. Pat. No. 6,589,644 B1, which is a 35 U.S.C. 371 National Stage of International Application No. PCT/JP98/02367 filed May 28, 1998, wherein International Application No. PCT/JP98/02367 was filed and published in the Japanese language.

BACKGROUND OF THE INVENTION

1. Field of the Invention

The present invention relates to low dielectric constant materials such as insulating films (dielectrics) used between LSI element layers, etc., and to their production and use.

2. Description of the Related Art

With higher speeds and higher integration of LSI elements, signal delays are becoming an ever more serious problem. Signal delays are related to the product of the wiring resistance R and the capacity C between the wirings and between layers, and an effective means of minimizing delays involves lowering the wiring resistance while also reducing the relative dielectric constant of the interlayer dielectrics. By the year 2001, it is said that higher integration will result in wiring spacings of about 0.18 μm, thus requiring materials with a relative dielectric constant of less than 2.5.

Previously known methods form films as interlayer dielectrics by a spin-on-glass (SOG) process using sols prepared by hydrolyzing tetraalkoxysilanes. However, the molecular structures of materials fabricated in this fashion have absolutely no voids in their three-dimensional network structures of ≡Si—O—Si≡, and their relative dielectric constants have been as high as 4.0. Some methods proposed for lowering the relative dielectric constant involve CVD for formation of SiOF films, formation of organic material films, and porous film formation. The relative dielectric constant of SiOF reduces to about 3.3 as the F content increases, but higher moisture absorption with greater F content has been a problem. Organic materials are low dielectric constant materials with relative dielectric constants of down to about 2.2, but their problems include poor heat resistance and low adhesion to substrates. In organic SOG systems, introduction of organic groups into $SiO_2$ has been investigated to achieve lower density and lower the relative dielectric constant, but the limit is said to be about 2.7. On the other hand, porous materials have variable relative dielectric constants depending on the amount of pores, and they are therefore promising as materials offering relative dielectric constants lower than 2.5.

One example of a porous material has been reported where inorganic SOG is reacted with a silylating agent to form a film and then the silylating agent is heat treated to decomposition to introduce approximately 80-nm pores, by which the relative dielectric constant has been lowered to 2.3 [N. Aoi, Jpn. J. Appl. Phys. 36(1997) 1355]. This film, however, has an increase of about 13% in the dielectric constant due to moisture absorption in air, while the introduced pores are also large so that only an average of 2 pores are present in a gap of 0.18 μm between wiring, and thus film strength is therefore a problem.

Another example of a porous film is a fine porous xerogel film obtained by forming a film of a solution made from tetraethoxysilane as the starting material, aging it under a controlled atmosphere, performing solvent substitution with a low surface tension solvent, drying it in such a manner that the film does not contract upon evaporation of the solvent, and treating the surface with a silylating agent [Mat. Res. Soc. Symp. Proc. 443, 99(1997)]. However, the xerogel not only has a complicated fabrication process but strict control is necessary for each step in the process, and therefore lack of reproducibility for actual device fabrication is thought to be one of its drawbacks. The basic backbone of the film is composed of a $SiO_4$ tetrahedron. The backbone interior is composed of only the $SiO_4$ tetrahedron, but because of the organic groups introduced by the silylating agent, organic groups substitute for some of the oxygens of the $SiO_4$ tetrahedrons only around the pores and on the surface.

Films formed from hydrogenated silica fine particles with surface Si—H bonds and modified with hydrogen silsesquioxane (HSQ) have been reported as materials with relative dielectric constants of less than 2.5 [Muraguchi et al., 58th Symposium of the Association of Applied Physics, Lecture Summary No.2, 4p-K-7]. However, the heat resistance of Si—H is not very high, as escape of hydrogen begins from 400° C. and is marked at 450° C. and above. Once hydrogen is released, the moisture absorption of the film begins to increase. Since the annealing temperature for metal wiring in LSI processes is said to be 450° C., this film would be expected to pose a problem when applied to such processes.

SUMMARY OF THE INVENTION

It is an object of the present invention to provide silica-based materials with low moisture absorption and a low dielectric constant, which can be applied for semiconductor elements and electrical circuit parts.

This object is achieved by the invention as described below.

1. A silica-based porous film having a three-dimensional network structure containing a siloxane skeleton comprising a $SiO_4$ tetrahedron structural unit, the silica-based porous film including on the surface and in the interior a backbone wherein at least one of the crosslinked oxygens of some or all of the $SiO_4$ tetrahedron structural units are replaced with organic groups, and having fine voids with an average size of no greater than 10 nm, preferably no greater than 5 nm, more preferably no greater than 2 nm, especially no greater than 1 nm the direct perimeters of which are surrounded with the backbone containing organic group-substituted tetrahedron structural units.

2. A silica-based porous film according to 1. above which includes in the three-dimensional network structure at least one element selected from the group consisting of B, Al, Ge, Ti, Y, Zr, Nb and Ta as an inorganic component in addition to Si and O.

3. A silica-based porous film according to 1. or 2. above, which contains at least a methyl group and/or phenyl group as the organic group.

4. A silica-based porous film according to any one of 1. to 3. above, which includes in the three-dimensional network structure at least one element selected from the group consisting of B, Al, Ge, Ti, Y, Zr, Nb and Ta as an inorganic component in addition to Si and O and which contains at least a methyl group and/or phenyl group as the organic group, wherein the molar ratio of the inorganic component element other than Si and O with respect to Si is from 0.005 to 0.15, and the molar ratio of the methyl group and/or phenyl group with respect to Si is from 0.6 to 1.5.

5. A silica-based porous film according to any one of 1. to 4. above, wherein the specific surface area according to BET is at least 100 $m^2/g$ and the contact angle of water is at least 90°.

6. A silica-based porous film according to 2. above, wherein the molecular structure of the main chain in the three-dimensional network structure includes at least one selected from among molecular structure (1): a ring structure, molecular structure (2): a structure wherein ring structure units including ladder-like structures and polyhedral structures are linked in two or three dimensions, and molecular structure (3): a linked chain structure which is crosslinked with at least two of the aforementioned structures and has no uncrosslinked ends.

7. A silica-based porous film according to 2. above, wherein the chemical structure of the terminal portion of the main chain in the three-dimensional network structure is —O—M'R'$^1$R'$^2$ . . . R'$^{m-1}$ (where R'$^1$, R'$^2$ . . . R'$^{m-1}$ are terminal groups and n is the valency of element M'), and the difference in electronegativity for all the bonded atom pairs of the M'R'$^1$ . . . R'$^{m-1}$ portion is no greater than 0.7.

8. A semiconductor device including a silica-based porous film according to any one of 1. to 7. above as an interlayer dielectric.

9. A process for production of a silica-based porous film, which comprises heat treating a silica-based film with at least two different organic groups bonded to Si having at least two different pyrolytic temperatures ($T_1$, $T_2$: $T_1 > T_2$) and with $SiO_2$ as the main inorganic component, in an inert gas atmosphere at a temperature intermediate between $T_1$ and $T_2$, and decomposing the organic groups that have pyrolytic temperature $T_2$ without decomposing the organic groups that have pyrolytic temperature $T_1$, to form voids with an average size of no greater than 10 nm in a three-dimensional network structure including a siloxane backbone.

10. A process for production of a silica-based porous film according to 9. above, wherein the organic groups that thermally decompose to form voids are alkyl groups of 2 or more carbon atoms or fluoro-substituted forms thereof, and the organic groups that remain in the film without being thermally decomposed are methyl groups or phenyl groups.

11. A silica-based porous film-forming coating solution which includes a solution obtained by dissolving (A1) a compound represented by the general formula $R^1Si(OR)_3$ or $R^1SiX_3$ (where $R^1$ is a methyl group or phenyl group, R is an alkyl group of 1–4 carbon atoms or a phenyl group, and X is a halogen element other than F) and (B1) a compound represented by the general formula $R^2R^3Si(OR)_2$ or $R^2R^3SiX_2$ (where $R^2$ and $R^3$ each is an alkyl group of 2 or more carbon atoms or a fluoro-substituted form thereof, or a methyl group or phenyl group, provided that at least one of $R^2$ and $R^3$ is an alkyl group of 2 or more carbon atoms or a fluoro-substituted form thereof, R is an alkyl group of 1–4 carbon atoms or a phenyl group, and X is a halogen element other than F) in an organic solvent followed by hydrolysis.

12. A silica-based porous film-forming coating solution which includes a solution obtained by dissolving (A2) a compound represented by the general formula $R^4Si(OR)_3$ or $R^4SiX_3$ (where $R^4$ is an alkyl group of 2 or more carbon atoms or a fluoro-substituted form thereof, R is an alkyl group of 1–4 carbon atoms or a phenyl group, and X is a halogen element other than F) and (B2) a compound represented by the general formula $R^5R^6Si(OR)_2$ or $R^5R^6SiX_2$ (where $R^5$ and $R^6$ are methyl and/or phenyl groups, R is an alkyl group of 1–4 carbon atoms or a phenyl group, and X is a halogen element other than F) in an organic solvent followed by hydrolysis.

13. A silica-based porous film-forming coating solution which includes a solution obtained by dissolving (A1) a compound represented by the general formula $R^1Si(OR)_3$ or $R^1SiX_3$ (where $R^1$ is a methyl group or phenyl group, R is an alkyl group of 1–4 carbon atoms or a phenyl group, and X is a halogen element other than F) and (A2) a compound represented by the general formula $R^4Si(OR)_3$ or $R^4SiX_3$ (where $R^4$ is an alkyl group of 2 or more carbon atoms or a fluoro-substituted form thereof, R is an alkyl group of 1–4 carbon atoms or a phenyl group, and X is a halogen element other than F) in an organic solvent followed by hydrolysis.

14. A silica-based porous film-forming coating solution according to any one of 11. to 13. above, wherein the coating solution contains a compound represented by the general formula $M(OR)_n$ or $MX_n$ (where M is at least one metal element selected from the group consisting of B, Al, Ge, Ti, Y, Zr, Nb, Ta and Si, n is the number of equivalences of the metal element, R is an alkyl group of 1–4 carbon atoms or a phenyl group, and X is a halogen element other than F), the molar ratio of M to Si is from 0.005 to 0.15, and the molar ratio of alkyl groups and/or phenyl groups to Si is from 0.6 to 1.5.

15. A silica-based porous film-forming coating solution according to 11. to 14. above, wherein the solute in the coating solution has a weight average molecular weight of less than 5,000, preferably less than 3,000, more preferably less than 1,000, especially less than 500.

16. A process for production of a silica-based porous film which comprises coating a solution according to any one of 11. to 15. above and then drying it at a temperature of from 70° C. to 300° C., heat treating it at a temperature of from 350° C. to 650° C. in an inert gas atmosphere and thermally decomposing the alkyl groups of 2 or more carbon atoms or their fluoro-substituted forms.

17. A low dielectric constant material comprising a compound with units represented by $M(\text{—O—})_n$, $R^1Si(\text{—O—})_3$ and $R^2R^3Si(\text{—O—})_2$ (where M is at least one metal element selected from among B, Al, Ge, Ti, Y, Zr, Nb, Ta and Si, n is the number of equivalences of the metal M, $R^1$, $R^2$ and $R^3$ each represent an alkyl group, aryl group or aralkyl group, and CF bonds are substituted for some or all of the CH bonds in $R^1$ and/or $R^2$).

18. A low dielectric constant material according to 17. above, wherein some or all of the $R^2$ groups are $(CH_2)_l(CF_2)_m CF_3$ (where l and m are integers of from 0 to 10), $R^1$ and $R^3$ are methyl groups, and when $R^2$ groups other than $(CH_2)_l(CF_2)_m CF_3$ are present, those $R^2$ groups are methyl groups.

19. A low dielectric constant material according to 17. or 18. above, wherein the molar ratio of the metallic element M of $M(\text{—O—})_n$ with respect to all the metallic elements is from 0.04 to 0.40, the molar ratio of Si directly bonded to alkyl groups, aryl groups or aralkyl groups wherein CF bonds are substituted for some or all of the CH bonds with respect to the total Si is from 0.15 to 0.6, and the molar ratio of alkyl groups, aryl groups or aralkyl groups with respect to the total Si is from 0.5 to 1.7.

20. An insulating film-forming coating solution which includes a solution obtained by dissolving a compound represented by
(A) $M(OR^4)_n$,
(B) $R^1Si(OR^5)_3$ and/or $R^{"1}Si(OR^7)_3$, or
(C) $R^2R^3Si(OR^6)_2$ and/or $R^2R^{"3}Si(OR^8)_2$
(Where M is at least one metal element selected from among B, Al, Ge, Ti, Y, Zr, Nb, Ta and Si, n is the number of equivalences of the metal M, $R^1$, $R^2$ and $R^3$ are each an alkyl group, aryl group or aralkyl group, $R^4$, $R^5$, $R^6$, $R^7$ and $R^8$ are each an alkyl group or phenyl group, and $R^{"1}$ and $R^{"3}$ are each an alkyl group, aryl group or aralkyl group wherein CF bonds are substituted for some or all of the CH bonds), in an organic solvent followed by hydrolysis.

21. A semiconductor device that employs an interlayer dielectric comprising a low dielectric constant material according to any one of 17. to 19. above.

22. A low dielectric constant material comprising a compound having a unit represented by $M(-O-)_n$ (where n is the number of equivalences of the metal M) with at least one metallic element M selected from among B, Al, Ge, Ti, Y, Zr, Nb and Ta and oxygen, and one or more Si units including at least one unit from among $R^1Si(-O-)_3$ and $R^2R^3Si(-O-)_2$ of the three different Si units represented by $Si(-O-)_4$, $R^1Si(-O-)_3$ and $R^2R^3Si(-O-)_2$ (where $R^1$, $R^2$ and $R^3$ are alkyl groups, aryl groups or aralkyl groups), such that when only the Si unit $R^1Si(-O-)_3$ is included some of $R^1$ groups are replaced with H, and when only the Si unit $R^2R^3Si(-O-)_2$ or both the Si units $R^1Si(-O-)_3$ and $R^2R^3Si(-O-)_2$ are included, some or all of the $R^1$ and/or $R^2$ groups are replaced with H.

23. A low dielectric constant material according to 22. above, which includes at least the unit $R^2R^3Si(-O-)_2$ of the three different Si units represented by $Si(-O-)_4$, $R^1Si(-O-)_3$ and $R^2R^3Si(-O-)_2$ (where $R^1$, $R^2$ and $R^3$ are alkyl groups, aryl groups or aralkyl groups), wherein some or all of the $R^2$ groups of the units are replaced with H and the $R^3$ groups of the units $HR^3Si(-O-)_2$ in which $R^2$ has been replaced with H are methyl groups.

24. A low dielectric constant material according to 22. or 23. above, wherein the molar ratio of Si with respect to the total metal elements is from 0.57 to 0.95, the molar ratio of Si directly bonded to hydrogen with respect to the total Si is 0.3 or greater, and the molar ratio of alkyl groups, aryl groups or aralkyl groups with respect to the total Si is from 0.5 to 1.7.

25. An interlayer dielectric comprising a low dielectric constant material according to any one of 22. to 24. above.

26. An IC chip comprising a low dielectric constant material according to any one of 22. to 24. above.

DETAILED DESCRIPTION OF THE INVENTION

Figure 1:
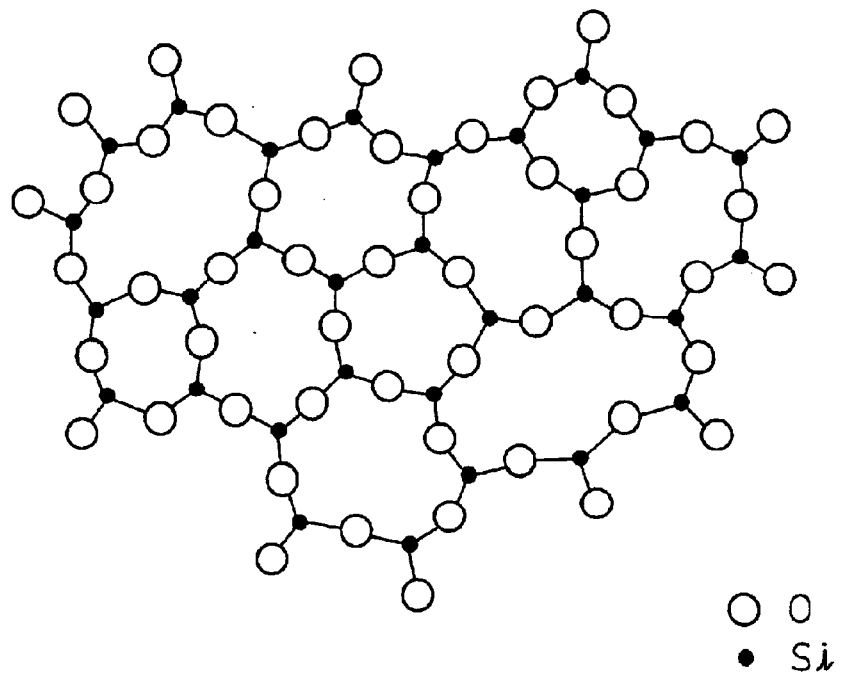
FIG. 1 is a illustrative sketch of the network structure of common silica glass. (The illustration is shown in two dimensions, whereas in the actual three dimensions the coordination number of Si is 4.)
Figure 2:
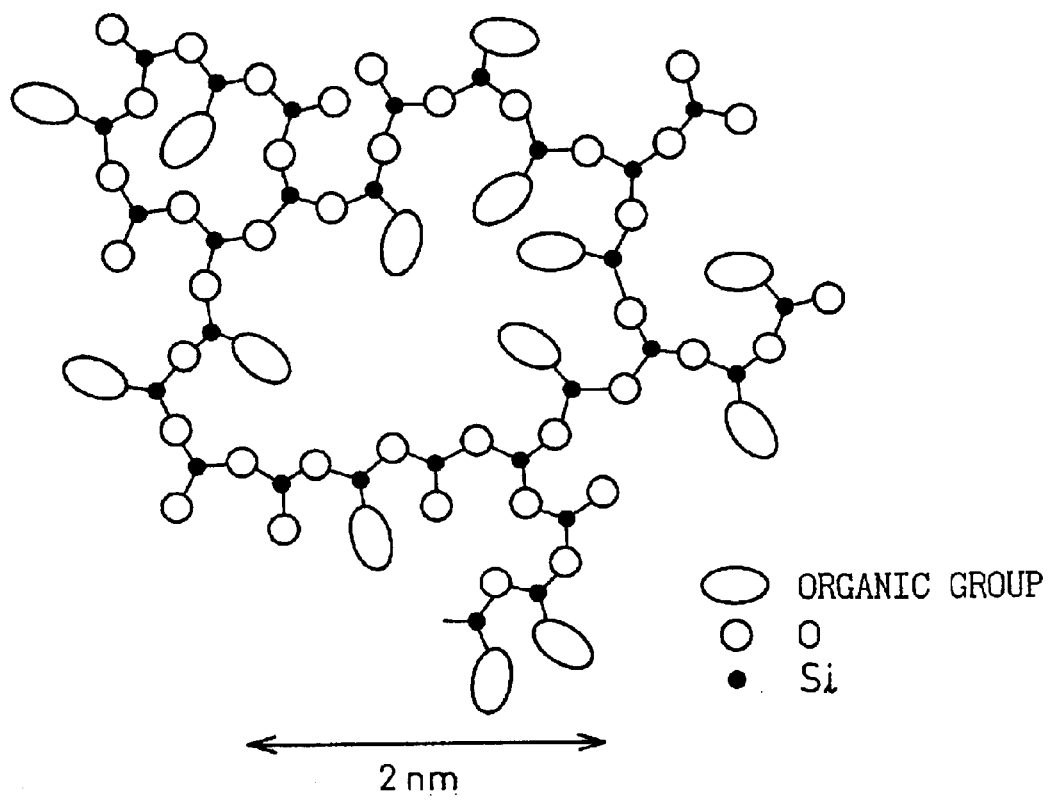
FIG. 2 is an illustrative sketch of the structure of a porous film according to the invention, which includes fine voids with an average size of no greater than 10 nm in the network structure of silica glass. (The illustration is shown in two dimensions, whereas in the actual three dimensions the coordination number of Si is 4.)

Silica glass usually has a three-dimensional network structure comprising an Si—O—Si siloxane backbone wherein $SiO_4$ tetrahedrons are connected with adjacent tetrahedrons via oxygen at all four apexes (FIG. 1). In contrast, the silica-based porous film of the invention includes at least one organic group bonded at one of the four apexes of each $SiO_4$ tetrahedron in the siloxane backbone-containing three-dimensional network structure, and therefore it is a glass composed mainly of $SiO_2$ that includes organic groups bonded to Si, where fine voids with an average size of 10 nm or less, preferably 5 nm or less, more preferably 2 nm or less, especially 1 nm or less are present in the glass. The three-dimensional network structure is composed of a backbone such as —Si—O—Si—O—Si— or —Si—O—M—O—Si— (where M is an element selected from among B, Al, Ge, Ti, Y, Zr, Nb and Ta). The three-dimensional network structure may also include, in addition to tetrahedrons wherein at least one organic group is bonded to one of the four apexes of the $SiO_4$ tetrahedron, also tetrahedrons wherein hydrogen and/or hydroxyl is bonded to one of the four apexes of the $SiO_4$ tetrahedron, and/or tetrahedrons which are connected to adjacent tetrahedrons through crosslinked oxygen at all four apexes of the $SiO_4$ tetrahedron. The voids according to the invention have an average size of no greater than 10 nm as estimated from a pore distribution curve determined by the method of Dollimore & Heal (DH method) based on the adsorption isotherm for $N_2$ gas at 77 K. Voids are therefore unobservable even at 500,000×magnification with a transmission electron microscope. An example of a porous film of the invention is shown in FIG. 2. The porous film of the invention has voids on the order of a molecular size formed in the network structure, as shown in FIG. 2.

The voids in the silica-based porous film of the invention are no greater than 10 nm on average, but it is preferred for substantially all of the voids to be 10 nm or smaller. The voids are determined by pore size distribution obtained by an experiment and the pore size distribution corresponds to the void size. It is possible to make the average void size to 5 nm, 2 nm, 1 nm or even smaller depending on the size of the molecule disconnected by thermal decomposition. More preferably, the pore size distribution peak is no greater than 5 nm.

The relative dielectric constant of the porous film of the invention will now be explained. When $SiO_4$ tetrahedrons with at least one hydroxyl group bonded to one of the four apexes, i.e. silanol groups (—SiOH) are present, the polarizability of the molecule itself is large while hydrogen bonding such as Si—OH ... H—OH absorbs moisture from the air, and therefore the relative dielectric constant of the material is increased when abundant silanol groups are present. In order to avoid moisture absorption by the silanol groups it is considered effective to render the inorganic backbone hydrophobic. The structure according to the invention has some or all of the Si in the siloxane backbone bonded to organic groups, such that hydrophobicity is provided by the organic groups to control moisture absorption. A porous film with this type of structure can exhibit a lower dielectric constant due to the effect of low density by the incorporated voids and the reduced moisture absorption by hydrophobicity provided by bonding of organic groups to the siloxane backbone. In order to achieve the effect of lower density and hydrophobicity, it is preferred for the molar ratio of organic groups to Si to be from 0.6 to 1.5. If the ratio is less than 0.6 there will be a minimal effect of lower density and hydrophobicity, and if it is greater than 1.5 the film strength will be reduced. If the average void size exceeds 10 nm the film strength will be weaker and the reliability will thus be insufficient as an insulating film. For example, problems may be caused upon chemical machine polishing (CMP) in that film stripping or inclusion of abrasive grains into the voids may occur, insulation properties may be lowered due to the acceleration of the diffusion of Cu used for wiring, or adhesion may be lowered due to the insufficient effective adhesion area. According to the invention, the relative dielectric constant of the silica-based porous film (in air) can be reduced to under 2.5.

The thickness of the porous film of the invention is preferably from 0.1 μm to 5 μm.

All porous interlayer dielectrics known to the prior art have inorganic skeletons composed mainly of Si—O, and they have been heat-treated in a substantially oxygen-free atmosphere gas or the OH groups have been replaced with organic groups, in order to remove the OH groups on film surfaces that include open pores (for example, U.S. Pat. Nos. 5,470,802 and 5,504,042). The present invention differs from the conventional silica-based porous films in that it includes, on the surface and in the interior, a backbone wherein at least one of the crosslinked oxygens of the $SiO_4$ tetrahedrons are replaced with organic groups, so that organic groups are introduced not only on the film surface that includes open pores, but also in the network structure itself. Conventional silica-based porous films consist of $SiO_2$ at sections other than the pores but, according to the invention, the organic groups are present even in the network structure so that the sections other than the pores are organic glass and have a lower relative dielectric constant than $SiO_2$. It is thus possible to achieve a relative dielectric constant comparable to that of a conventional porous film with a lower void percentage than a conventional porous film. The strength and reliability of the porous film is therefore enhanced.

This three-dimensional network structure can be expected to exhibit an even lower relative dielectric constant by including at least one metallic element selected from among B, Al, Ge, Ti, Y, Zr, Nb and Ta in addition to Si and O. Materials for introducing at least one metallic element M selected from among B, Al, Ge, Ti, Y, Zr, Nb and Ta into porous films, such as $M(OR)_n$ or $MX_n$, have high reactivity. It is believed that their ready reactivity with the low-reactive silanol (SiOH) groups present in the film can remove OH from the silanol groups and thus lower the relative dielectric constant. The molar ratio of M to Si is preferably from 0.005 to 0.15. If the ratio is less than 0.005 the effect of reducing silanol groups will be less notable, and if it is higher than 0.15 the relative dielectric constant will be higher.

A methyl group or phenyl group is most effective as the organic group used for substitution for at least one crosslinked oxygen of the $SiO_4$ tetrahedron. The bonding of Si with the organic group preferably has a thermal stability that can withstand the treatment at 450° C. required for LSI processes, while its own polarizability is preferably low. When incorporated into siloxane network structures, methyl and phenyl groups both have heat resistance of up to 650° C. and low polarizability, and are therefore effective as organic groups to be bonded with the Si.

The silica-based porous film of the invention has a specific surface area of 100 $m^2/g$ or greater, and preferably 200 $m^2/g$ or greater, as measured by the BET method using Kr gas. While nitrogen gas is most often used for measurement by the BET method, for porous films that have rather low adsorptivity, a more precise measurement can be obtained using Kr which has a lower saturation vapor pressure than nitrogen. If the specific surface area is less than 100 $m^2/g$ as measured by the BET method using Kr gas, there are fewer pores and the effect of a reduced relative dielectric constant due to lower density is less notable. The contact angle of water is preferably 90° or larger. At less than 90°, the degree of hydrophobicity is insufficient causing the film to exhibit moisture absorption, and the more abundant OH groups with high polarizability result in a higher relative dielectric constant.

The porosity of the silica-based porous film of the invention is the ratio of the surface area of the porous film formed on a flat substrate (minus the side and bottom surface area of the substrate) $S_{BET}$ and the area of the flat substrate on which the film is formed $S_{geo}$, and the ratio of $S_{BET}/S_{geo}$ (=r) exceeds 80. According to the invention this ratio $S_{BET}/S_{geo}$ is at least 100, preferably at least 120, more preferably at least 150 and especially at least 175, but 200–300 is theoretically possible. It is convenient to use a Si wafer as the flat substrate.

The void volume of the silica-based porous film can be roughly calculated by measuring the film density before and after loss of the thermally decomposable organic groups. The void volume of the silica-based porous film of the invention is preferably 10% or greater, more preferably 15% or greater, even more preferably 20% or greater, and especially 25% or greater. If the void volume is low an effect of a lower relative dielectric constant cannot be achieved. The upper limit for the void volume is not particularly restricted and may be appropriately selected in connection with the film strength, but 80% or lower is generally considered to be preferable, while it is a characteristic of the invention that a sufficiently low relative dielectric constant can be achieved even at lower than 50%.

Using a low dielectric constant silica-based porous film of the invention as an interlayer dielectric in a semiconductor device such as an LSI element offers the advantage of reducing the parasitic capacity between wiring and between layers, thus increasing the operation speed.

The voids in the three-dimensional network structure forming the porous film of the invention can be formed by thermally decomposing the organic groups bonded to the Si. That is, when hydrophobic organic groups (such as methyl) remaining in the final film and a bulky organic group with a low pyrolytic temperature (referred to as "Rpyr" below) are bonded to Si, a three-dimensional network structure is first formed incorporating these organic groups. Next, heat-treatment is carried out at a temperature between $T_1$ and $T_2$, where $T_1$ and $T_2$ are the respective pyrolytic temperatures of the hydrophobic organic group remaining in the film and the bulky organic group Rpyr with a low pyrolytic temperature. This heat-treatment causes Rpyr to escape out of the film, the traces thereof remaining as voids. Forming voids in this manner produces voids of 10 nm or smaller in a uniform manner throughout the film, which are sufficiently minute compared to the spaces between wirings in a semiconductor device or the like, and thus a porous film with high film strength is obtained. The organic groups that remain in the film without being decomposed maintain the hydrophobicity of the film, so that a low dielectric constant can be expected. It is not necessary to achieve 100% decomposition of Rpyr at this time. For example, about 10% of the Rpyr may remain in the film. A portion of the atoms constituting the Rpyr may also remain, or bonds may be formed with an organic component that can leave more voids due to a smaller bulk than the Rpyr, at sections where the bonds with Si have been broken by decomposition of the Rpyr. For example, when Rpyr is an alkyl group of 2 or more carbon atoms, a group with an Si—$CH_3$ bond or Si—H bond may be produced at the root portion that breaks from the terminal carbon and bonds to Si. Alternatively, after pyrolysis of the Rpry in an Si—Rpyr bond, the Si may bond with another Si via oxygen to form an Si—O—Si bond.

Since the pyrolytic temperature of the organic group generally decreases in the order of phenyl group>methyl group>alkyl group of 2 or more carbon atoms, the organic group Rpyr that undergoes pyrolysis is preferably an alkyl group of 2 or more carbon atoms or a fluorosubstituted form thereof. The organic groups remaining in the film are preferably methyl groups or phenyl groups.

A process has been proposed for producing porous silica bodies wherein at least some of the organic groups in silsesquioxane crosslinked with organic groups, especially allyl groups, are oxidized with an oxidizing agent such as oxygen plasma, to make pores from the traces of the organic groups (U.S. Pat. No. 5,321,102). The porous bodies obtained by this process are used as molecular sieves and catalyst carriers, and even if organic groups remain there has been no active utilization of the remaining organic groups. According to the present invention, however, a plurality of different organic groups are incorporated beforehand and only the low pyrolytic temperature organic groups are selectively decomposed, so that high pyrolytic temperature organic groups definitely remain in the finally obtained porous film. The invention also differs in that the film is rendered hydrophobic by the organic groups remaining in the film, so that a low dielectric constant can be achieved.

Also, a process has been proposed for producing a porous film by dispersing a low molecular weight organic polymer in methylsilsesquioxane and thermally decomposing only the organic polymer through heat treatment (Julius F. Remenar, et al., MRS 1998 Spring Meeting, Abstract p97, E2.4; U.S. Pat. No. 5,700,844). The size of the pores obtained by this process appears to be dependent on the phase separation conditions of the siloxane polymer and the thermally decomposing organic polymer. Where the organic polymer is polymethyl methacrylate pores of a size of the order of micron are formed, while the organic polymer is polycaprolactone pores of a size of 10 nm are formed. In the present invention, since the thermal decomposition of the organic groups directly bonded to Si but not of a blend of polymers, a porous body of fine pores can be produced.

A coating solution for formation of a silica-based porous film according to the invention will now be described. In order to obtain a three-dimensional network structure containing siloxane bonds including tetrahedrons wherein at least one of the crosslinked oxygens of the $SiO_4$ tetrahedron is replaced with an organic group, and having fine voids with an average size of 10 nm or smaller the direct perimeters of which are surrounded with the backbone including these tetrahedrons, it is necessary for the coating solution to definitely include either or both hydrolysates of (A) a compound represented by the general formula $R'Si(OR)_3$ or $R'SiX_3$ (where R' is an organic group, R is an alkyl group of 1–4 carbon atoms or a phenyl group, and X is a halogen element other than F), and (B) a compound represented by the general formula $R''R'''Si(OR)_2$ or $R''R'''SiX_2$ (where R'' and R''' are each an organic group, R is an alkyl group of 1–4 carbon atoms or a phenyl group, and X is a halogen element other than F).

Compounds belonging to group (A) are alkoxides wherein only one organic group is bonded to Si, and compounds belonging to group (B) are alkoxides wherein two organic groups are bonded to Si. The organic groups bonded in the Si alkoxides of compounds of groups (A) and (B) are of two types. The first includes organic groups that remain in the finally obtained silica-based porous film and have the effect of lowering the moisture absorption. The second includes organic groups that undergo pyrolysis to introduce voids in the film. The matter of classifying two types of organic groups as organic groups that bond with the Si alkoxides of either (A) or (B) is a very important point in designing the coating solution.

Japanese Examined Patent Publication No. 8-3074 proposes a silica-based film-forming coating solution prepared by dissolving at least two different compounds selected from among alkoxysilane compounds represented by $Q'_{4-m}Si(OQ)_m$ (where Q' is an alkyl group of 1–3 carbon atoms or a phenyl group, Q is an alkyl group of 1–3 carbon atoms and m is an integer of 2–4) in an organic solvent, and hydrolyzing them to give a coating solution. Also, Japanese Unexamined Patent Publication No. 3-20377 proposes coating solutions synthesized from bifunctional and trifunctional Si alkoxides wherein lower alkyl groups of 1–4 carbon atoms or aryl groups are bonded to Si, and various metal alkoxides coordinated with chelating agents. Japanese Unexamined Patent Publication No. 6-346025 proposes a coating composition employing a mixture containing 1–20 moles of a trifunctional silane to one mole of a bifunctional silane, and mentions hydrogen, alkyl groups, aryl groups, alkenyl groups and their substituted forms as non-hydrolyzable groups that bond with the bi- and trifunctional silanes. However, the inventions of Japanese Unexamined Patent Publication No. 8-3074, Japanese Unexamined Patent Publication No. 3-20377 and Japanese Unexamined Patent Publication No. 6-346025 are all designed for forming thick films with no cracks or pinholes. The concept of partial pyrolysis of only some of the organic components during formation of such thick films has not existed in the prior art, and dense films have been formed. The present invention provides a coating solution to form porous films by utilizing the difference in pyrolytic temperatures of the organic groups, and because porous films can be formed, it has become possible to obtain low relative dielectric constants that have not been achievable with silica-based coated films by the conventional organic SOG. The present invention differs in this major respect from Japanese Examined Patent Publication No. 8-3074, Japanese Unexamined Patent Publication No. 3-20377 and Japanese Unexamined Patent Publication No. 6-346025. According to the invention it is possible to achieve relative dielectric constants in air of lower than 2.5, and even lower than 2.4, lower than 2.3 and lower than 2.2.

The coating solution of 11. above will be explained first. (A1) General formulas $R^1Si(OR)_3$ and $R^1SiX_3$ (where $R^1$ is a methyl group or phenyl group, R is an alkyl group of 1–4 carbon atoms or a phenyl group, and X is a halogen element other than F) represent compounds belonging to group (A), and they are starting materials for introducing organic groups that remain in the silica film and reduce its moisture absorption, while also forming the siloxane skeleton. Specifically there may be mentioned methyltriethoxysilane, methyltrimethoxysilane and phenyltriethoxysilane. (B1) General formulas $R^2R^3Si(OR)_2$ and $R^2R^3SiX_2$ (where at least one of $R^2$ and $R^3$ is an alkyl group of 2 or more carbon atoms or a fluoro-substituted form thereof, or a methyl group or phenyl group, R is an alkyl group of 1–4 carbon atoms or a phenyl group, and X is a halogen element other than F) represent compounds belonging to group (B). The compounds of (B1) are starting materials wherein organic groups that form voids by undergoing pyrolysis bond with Si, so that a siloxane backbone is formed that contains voids. As specific compounds of (B1) there may be mentioned n-octadecylmethyldiethoxysilane, n-octylmethyldiethoxysilane, isobutylmethyldichlorosilane, dimethoxymethyl-3,3,3-trifluoropropylsilane, diisobutyldimethoxysilane, phenylethyldichlorosilane and t-butylphenyldichlorosilane. One or more compounds from each group of (A1) and (B1) are selected and dissolved in an organic solvent, and hydrolyzed to obtain a silica-based porous film-forming coating solution. The solution may also contain, in addition to the compounds selected from (A1) and (B1), a compound such as diethoxydimethylsilane having two non-pyrolytic organic groups that bond to Si, and/or hydrolysates thereof. It may further contain a compound represented by (C) general formula $M(OR)_n$ or $MX_n$ (where M is at least one metal element selected from among B, Al, Ge, Ti, Y, Zr, Nb, Ta and Si, n is the number of oxygen atoms to which the metal M is bonded, R is an alkyl group of 1–4 carbon atoms or a phenyl group, and X is a halogen element other than F). When a compound represented by (C) is included, using Si for M provides an effect of maintaining the film strength, while using a metal element selected from among B, Al, Ge, Ti, Y, Zr, Nb and Ta for M provides an effect of enhanced film strength as well as fewer silanol groups in the film.

The coating solution of 12. above will now be explained. (A2) General formula $R^4Si(OR)_3$ and $R^4SiX_3$ (where $R^4$ is an alkyl group of 2 or more carbon atoms or a fluoro-substituted form thereof, R is an alkyl group of 1–4 carbon atoms or a phenyl group, and X is a halogen element other than F) represent compounds belonging to group (A). The compounds of (A1) are starting materials wherein organic groups that form voids by undergoing pyrolysis bond with Si, so that a siloxane backbone is formed that contains voids. As specific compounds there may be mentioned isobutyltriethoxysilane, t-butyltrichlorosilane, (3,3,3-trifluoropropyl)trimethoxysilane and (tridecafluoro-1,1,2,2-tetrahydrooctyl)triethoxysilane. (B2) General formula $R^5R^6Si(OR)_2$ and $R^5R^6SiX_2$ (where $R^5$ and $R^6$ are methyl or phenyl groups, R is an alkyl group of 1–4 carbon atoms or a phenyl group, and X is a halogen element other than F) represent compounds belonging to group (B), and they are starting materials for introducing organic groups that remain in the silica film and reduce its moisture absorption, while also forming the siloxane backbone. Specifically there may be mentioned diethoxydimethylsilane, dimethoxydimethylsilane, phenylmethyldimethoxysilane and diphenyldichlorosilane. One or more compounds from each group of (A2) and (B2) are selected and dissolved in an organic solvent, and hydrolyzed to obtain a silica-based porous film-forming coating solution. The solution may also contain, in addition to (A2), (B2) and (C), also a compound of (B1) described above and/or a hydrolysate thereof. It may also contain a compound of (C) as explained in 8. above. The effect of including a compound of (C) is the same as described for the coating solution of 11. above.

The coating solution of 13. above will now be explained. (A1) and (A2) are as defined above. One or more compounds from each group of (A1) and (A2) are selected and dissolved in an organic solvent, and hydrolyzed to obtain a silica-based porous film-forming coating solution. The solution may also contain, in addition to (A1), (A2) and (C), also a compound of (B1) or (B2) described above and/or a hydrolysate thereof. It may also contain a compound of (C) as explained above. The effect of including a compound of (C) is the same as described for the coating solution of 11. above.

In the coating solutions of 11. to 13. above, the molar ratio of M to Si is preferably from 0.005 to 0.15. If it is less than 0.005 the effect of reduced silanol groups will be less notable, and if it is higher than 0.15 the relative dielectric constant will be higher. The molar ratio of methyl groups and/or phenyl groups to Si is preferably from 0.6 to 1.5. If it is less than 0.6 there will be a minimal effect of lower density and hydrophobicity, and if it is greater than 1.5 the film strength will be reduced.

Preferably, the solute in the silica-based porous film-forming coating solution according to the invention has a weight average molecular weight of less than 5,000, more preferably less than 3,000, still more preferably less than 1,000, especially less than 500. The weight average molecular weight can conveniently be determined from a molecular weight distribution calculated as styrene measured by gel permeation chromatography (GPC). If this molecular weight is small, i.e., the polymerization degree is low, a film can easily be obtained in which an Si alkoxide or halide bonded with a bulky and low thermal decomposition temperature organic group $R_{pyr}$ is uniformly dispersed. If the $R_{pyr}$ groups are uniformly dispersed, pores subsequently formed through thermal decomposition are also uniformly dispersed and have a very small size of molecular level of 10 nm or less, 5 nm or less, 2 nm or less, or even further 1 nm or less. When a coating solution of a solute having a weight average molecular weight of not less than 5,000 is coated and the obtained film is heat treated, the size of the pores may undesirably be larger than 10 nm. Where the polymerization degree is low, the coating solution exhibits a Newtonian viscosity which does not depend on the rate of shear. The viscosity varies depending on the solute concentration, i.e., the solid content of the coating solution and generally be 0.5 to 3.0 mPa·s.

When an alkoxide is used to fabricate the low dielectric constant material of the invention, some of the alkoxy groups may be alkoxide derivatives substituted with β-diketones, β-ketoesters, alkanolamines, alkylalkanolamines or organic acids.

In the hydrolysis for the invention, up to a two-fold molar amount of water with respect to the total alkoxy groups may be added for hydrolysis. Here, either an inorganic acid, organic acid or both may be used as a catalyst. The pH of the solution may also be adjusted with an alkali to control the hydrolysis reaction. The water added may be diluted with an organic solvent such as an alcohol. It is not preferred to use more than a two-fold molar amount of water, because this will considerably shorten the usable life of the coating solution used to form the film, and result in gelation of the coating solution during storage.

For the hydrolysis there are used a Si starting material such as an alkylalkoxysilane and an organic solvent that can homogeneously disperse and dissolve metal alkoxides. Examples include alcohols such as methanol, ethanol, propanol, butanol, etc. and acetone, toluene, xylylene, etc.

After the hydrolysis, the alcohol, etc. which was used as the solvent or which was produced by the hydrolysis may be distilled off at normal pressure or under reduced pressure prior to coating. The coating onto the substrate may be accomplished by spray coating, dip coating, spin coating or the like.

The coated film is first dried at 70–300° C. to evaporate off the solvent. It is then heat treated at 350–650° C. in an inert gas for pyrolysis of the bulky organic groups with a low pyrolytic temperature. The inert gas used may be $N_2$, Ar, He or a mixed gas thereof. When the sample is loaded into and removed from the heat treating furnace, and during the heat treatment, it is preferred to prevent air from being drawn into the heat treating furnace so that the oxygen concentration of the inert gas is no greater than 100 ppm, more preferably no greater than 50 ppm and even more preferably no greater than 20 ppm. If the heat treatment temperature is below 350° C. the decomposition of the organic groups of low pyrolytic temperature will not occur, and therefore voids will not be produced and the relative dielectric constant will not be sufficiently increased. If it is above 650° C., all of the organic groups will decompose, so that the moisture absorption will increase considerably and the relative dielectric constant will be raised by OH groups in the film.

The insulating film of the invention described above can be applied as-an interlayer dielectric for an LSI element in semiconductor devices and various electronic parts. It can also be utilized as a catalyst carrier.

The low dielectric constant material of the invention will now be explained in greater detail by way of the following examples.

EXAMPLE 1

Figure 3:
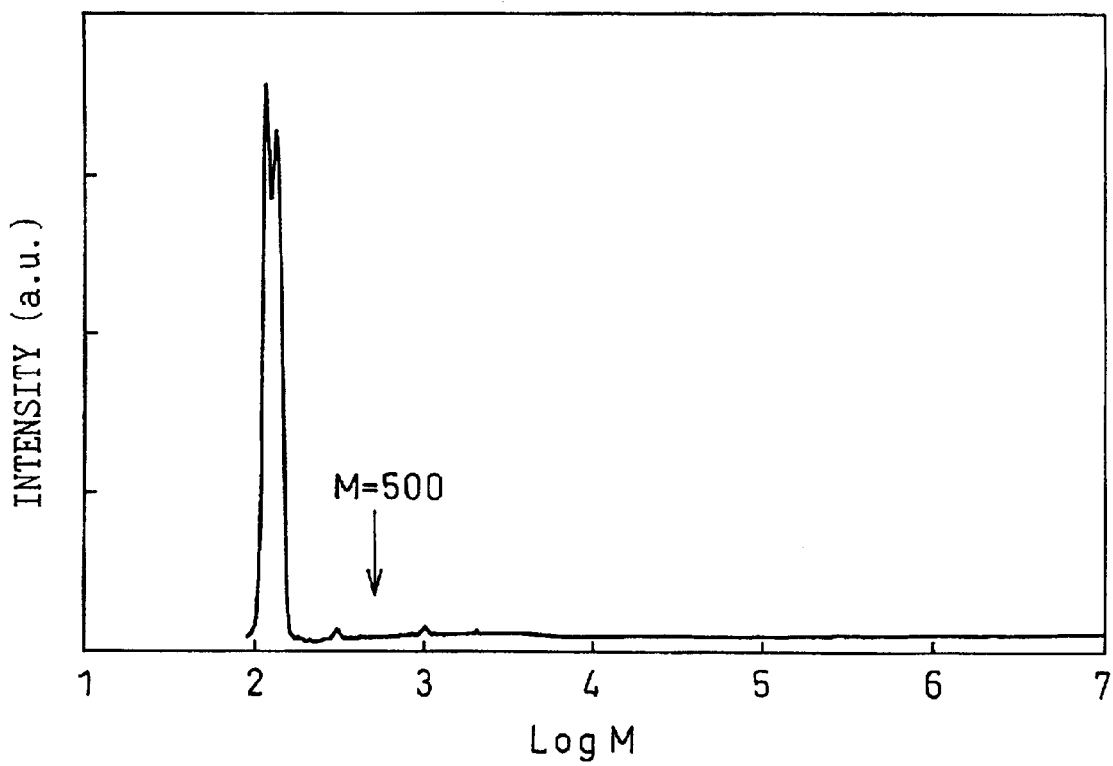
FIG. 3 is a graph showing the molecular weight distribution obtained from a GPC measurement result in an Example of the invention. The abscissa represents the molecular weight M calculated as styrene in a log scale. The point of the molecular weight M of 500 is indicated by an arrow. The ordinate represents UV absorption intensity at the time of GPC measurement.

Dimethoxymethyl-3,3,3-trifluoropropylsilane that had been pre-hydrolyzed in a two-fold molar amount of water in ethanol, tetraethyl orthotitanate that had been reacted with ethyl acetoacetate, and methyltriethoxysilane were mixed in a molar ratio of 12:1:24 in an ethanol solvent. After mixing, the mixture was hydrolyzed in a 70-fold molar amount of water with respect to the tetraethyl orthotitanate. Viscosity of the obtained coating solution was measured and found to be 1.95 mPa·s in a cone rotor-rotating speed range of 10 to 100 rpm. Then, the coating solution was solved in tetrahydrofuran and measured for the molecular weight calculated as styrene by GPC. The molecular weight distribution based on the UV absorption is shown in FIG. 3.

The two peaks exist at the vicinity of a molecular weight of 120 and are based on the alkoxide of Si but not on a solvent such as ethanol or methanol. It is proved that the solute, i.e., the hydrolyzates of the alkoxides of silicon and titanium in the coating solution exhibit very low polymerization degree. This adjusted solution was spin coated onto an Si wafer bearing platinum as a lower electrode for electric capacity measurement and onto an Si wafer for FT-IR measurement to form films thereon, after which they were dried for one minute each on hot plates set to temperatures of 70° C., 150° C. and 200° C., in that order. Heat-treatment was then carried out for 20 minutes at 450° C. in a nitrogen atmosphere using an infrared furnace.

The FT-IR spectra revealed a structure with methyl groups and $-CH_2CH_2CF_3$ in each $SiO_2$ film prior to the heat treatment at 450° C., but after the heat treatment showed a structure wherein the $-CH_2CH_2CF_3$ groups had undergone pyrolysis resulting in complete disappearance of peaks attributable to CF bonds, so that only methyl groups were present in each film. Measurement of the specific surface area by the BET method using Kr gas indicated a dense film matching the specific surface area calculated from the geometrical shape of the wafer prior to heat treatment at 450° C., whereas the heat treated film had a specific surface area of 260 $m^2/g$ based on the film weight. The ratio $S_{BET}/S_{geo}$ of the surface area of the film and the substrate area calculated from the size of the Si wafer was 175. The density of the film was 1.2. The density was 1.5 when the film was formed with heat treatment at 380° C. in nitrogen for 20 minutes so that all of the $CH_2CH_2CF_3$ groups remained without undergoing pyrolysis. The void volume as determined by the change in film density was approximately 20%. These experimental results indicate that the film obtained by treatment at 450° C. includes fine voids produced by pyrolysis of organic groups. The pore size distribution was determined by the DH method based on an adsorption isotherm for $N_2$ gas at 77 K. The pore size was distributed in the region of 5 nm and smaller, and the peak was near 2 nm. A strip with a thickness of approximately 10 nm was also fabricated and observed with a TEM at a magnification of 4,000,000×, but no pores were found. Since pores of about 5 nm can be detected with a TEM, it is thought that the pores of the film of the invention are even finer. Upon peeling off the film and subjecting it to $^{29}Si$ and $^{13}C$ NMR measurement, it was found that the peaks attributed to the three different C atoms in $-CH_2CH_2CF_3$ had disappeared by heat treatment at 450° C., leaving only the C of $-CH_3$. As concerns the Si nucleus, after heat treatment at 450° C. all of the Si was of the $T^3$ type bearing one methyl group (Si nucleus with three bonds to Si via O).

The thickness of the fabricated film was approximately 500 nm. After heat treatment, the sample was allowed to stand in a common dessicator for one week, a 1-mm diameter Al electrode was attached as an upper electrode and the electric capacity was measured with an impedance analyzer in air and in vacuum. When the relative dielectric constant was calculated based on these results, the relative dielectric constant in air was 2.3 and the relative dielectric constant in vacuum was 2.2. The difference between the dielectric constants in air and in vacuum indicates that moisture is being adsorbed by the film in air. While the dielectric constant of a silica film is generally 4 or less, the dielectric constant of water is 80 at 20° C., and therefore even a small degree of adsorption will drastically affect the dielectric constant, so that this can serve as an indicator to evaluate trace moisture absorption. The difference in dielectric constants due to moisture absorption in this example was 4%, which is exceedingly small for a porous film. This is attributed to incorporation of methyl groups into the film, rendering the film itself hydrophobic and thus blocking entrance of moisture. As a result of measurement with a contact angle instrument, the contact angle of water was found to be 101°, thus confirming considerable hydrophobicity.

EXAMPLE 2

Tetraethyl orthotitanate that had been reacted beforehand with ethyl acetoacetate, and methyltriethoxysilane and isobutyltriethoxysilane were mixed in a molar ratio of 1:1:5 in an ethanol solvent. After mixing, the mixture was hydrolyzed in a 10-fold molar amount of water with respect to the tetraethyl orthotitanate. This adjusted solution was spin-coated onto an Si wafer bearing platinum as a lower electrode for electric capacity measurement and onto an Si wafer for FT-IR measurement to form films thereon, after which they were dried for one minute each on hot plates set to temperatures of 70° C., 150° C. and 200° C., in that order. Heat treatment was then carried out for 30 minutes at 450° C. in a nitrogen atmosphere using an infrared furnace.

The FT-IR spectra revealed a structure with methyl groups and isobutyl groups in each $SiO_2$ film prior to the heat treatment at 450° C., but after the heat treatment showed a structure wherein the isobutyl groups had undergone pyrolysis resulting in complete disappearance of peaks attributable to isobutyl groups, so that only methyl groups were present in each film. This suggests that the obtained film includes fine voids produced by pyrolysis of isobutyl groups.

The thickness of the fabricated film was approximately 600 nm. After heat treatment, the sample was allowed to stand in a common dessicator for one week, a 1-mm diameter Al electrode was attached as an upper electrode and the electric capacity was measured with an impedance analyzer in air and in a vacuum. When the relative dielectric constant was calculated based on these results, the relative dielectric constant in air was 2.45 and the relative dielectric constant in the vacuum was 2.3, indicating that a film with a low dielectric constant and low moisture absorption had been obtained.

Comparative Example 1

Dimethoxydimethylsilane, methyltriethoxysilane and tetramethoxysilane were mixed in a molar ratio of 1:1:2 in ethanol, and hydrolysis was carried out in an equimolar amount of water with respect to the total alkoxy groups. After forming films and drying in the same manner as the examples, they were heat treated at 400° C. for 30 minutes in nitrogen.

The FT-IR spectra revealed that each film contained methyl groups in roughly the same amounts as the charged composition. The results of measurement of the specific surface area by the BET method indicated that the film was dense.

The relative dielectric constants were 3.0 in air and 2.8 in vacuum. The film contained methyl groups as organic groups in the silica, but since virtually no voids were present it was not possible to reduce the dielectric constant to under 2.5.

According to the invention as described above, there were obtained silica-based porous films with low relative dielectric constants in air of less than 2.5, and with low moisture absorption. Since electrical signal delay will be reduced if this low dielectric constant material is applied as an interlayer insulating film for LSIs in semiconductor elements and electric circuit parts, they are suitable for achieving higher device speeds.

The relative dielectric constant is a physical value representing the macroscopic polarization of a material, and the source thereof is the polarization due to orientation of the molecules of the material and the polarization arising from each individual molecule. In materials with a three-dimensional network structure the orientation polarization can be ignored, and therefore the dielectric constant ∈ is represented by the following equation (1):

$$\frac{\varepsilon-1}{\varepsilon+2} = \frac{4\pi}{3}\frac{\rho N_A}{W}\alpha \quad (1)$$

where ρ is the density of the material and α is the polarizability of the molecules of the material. Also, W is the molecular weight of the molecules and $N_A$ is Avogadro's number. The polarizability is obtained as the sum of the electronic polarizability and the oscillation polarizability due to electron oscillation. When no shared electrons are present as in the material of the invention, the electronic polarizability is roughly equivalent to the sum of the characteristic electronic polarizabilities of each chemical bond in the molecule, and the effect of the molecular structure is extremely minimal. However, the oscillation polarizability is the sum of the contribution from all of the normal oscillation modes, and is represented by the following equation (2):

$$\alpha_{uv}^{vib} = \sum_{a}^{3N-6} \frac{[\partial\mu_u/\partial Q_a][\partial\mu_v/\partial Q_a]}{\omega_a^2} \quad (2)$$

Here, μ is the dipole moment, a is the normal oscillation mode, $Q_a$ is the normal oscillation coordinate and $\omega_a$ is the normal oscillation frequency. Since $\omega_a$ will differ even for the same molecule due to conformation and shape, the oscillation polarizability is affected by the molecular structure. In particular, for linear molecules with free ends, the minimum normal oscillation mode is a low frequency of 10 cm$^{-1}$ or lower, and this has a dominant effect on the oscillation polarizability, as seen by equation (2). In addition, if the end has a strong polarity as in the case of an OH group, the change in dipole moment corresponding to the molecule in equation (2) will increase, so that the oscillation polarizability will reach about 3 times the electron polarizability. Thus, in order to lower the relative dielectric constant it is necessary to control the oscillation polarization by structuring the material with molecular structural units having no free ends and a high normal oscillation frequency.

Figure 4:
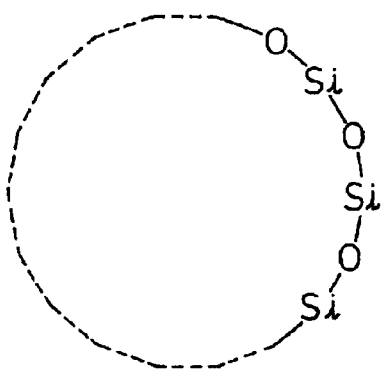
FIG. 4 is a sketch showing a specific example of molecular structure (1).
Figure 5:
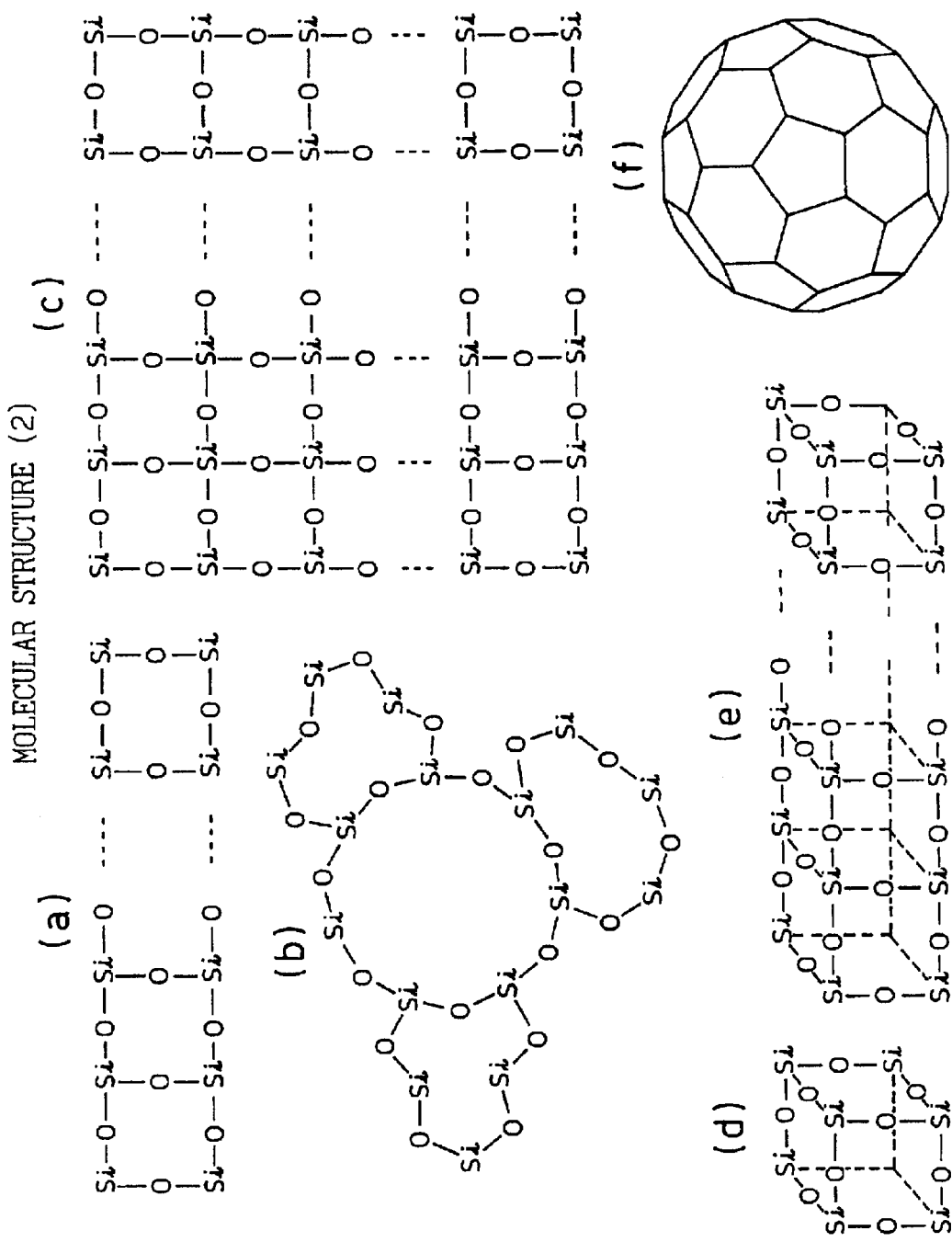
FIG. 5 is a series of sketches showing a specific example of molecular structure (2).

According to the invention, such a molecular structure is provided by molecular structures (1), (2) and (3). FIG. 4, 5(a), (b), (c), (d), (e) and (f) and FIG. 6(a) and (b) are sketches showing examples of the respective structure. In FIG. 5(f), each side represents an Si—O—Si bond, and molecular structure (3) is represented by the sections indicated by bold lines in FIG. 6(a) and (b). Since molecular structures (1) and (2) have no linear ends, the effect is that $\omega_a$ is high and the oscillation polarization is reduced. In structures where molecular structure (1) or (2) is linked by molecular structure (3), $\omega_a$ is lower than with molecular structure (1) or (2) alone, but since no linear ends with polar groups are present, the oscillation polarization does not increase. Molecular structures that do not belong to molecular structure (1), (2) or (3) are linear structures with free ends as shown in FIG. 7(a), (b), (c), (d), (e) and (f), and as mentioned above, such molecular structures have high oscillation polarization and are therefore undesirable from the standpoint of lowering the dielectric constant of the material.

The electronic polarizability and oscillation polarizability for these molecular structures were calculated by the molecular orbital method. Table 1 shows the calculation results for the molecules shown in FIG. 4, FIG. 5(a), FIG. 5(d), FIG. 6(a) and FIG. 7(a). All of the Si substituents were methyl groups, the ends of the molecules in FIG. 7(a) were —Si(CH$_3$)$_2$—OH, and the ring sections in FIG. 6(a) were included in the calculations. The polarizabilites shown in Table 1 are the values for each Si atom. Table 1 shows that molecular structures (1), (2) and (3) have low oscillation polarizability, and that linear structures with free ends have high oscillation polarizability.

TABLE 1

Figure 6:
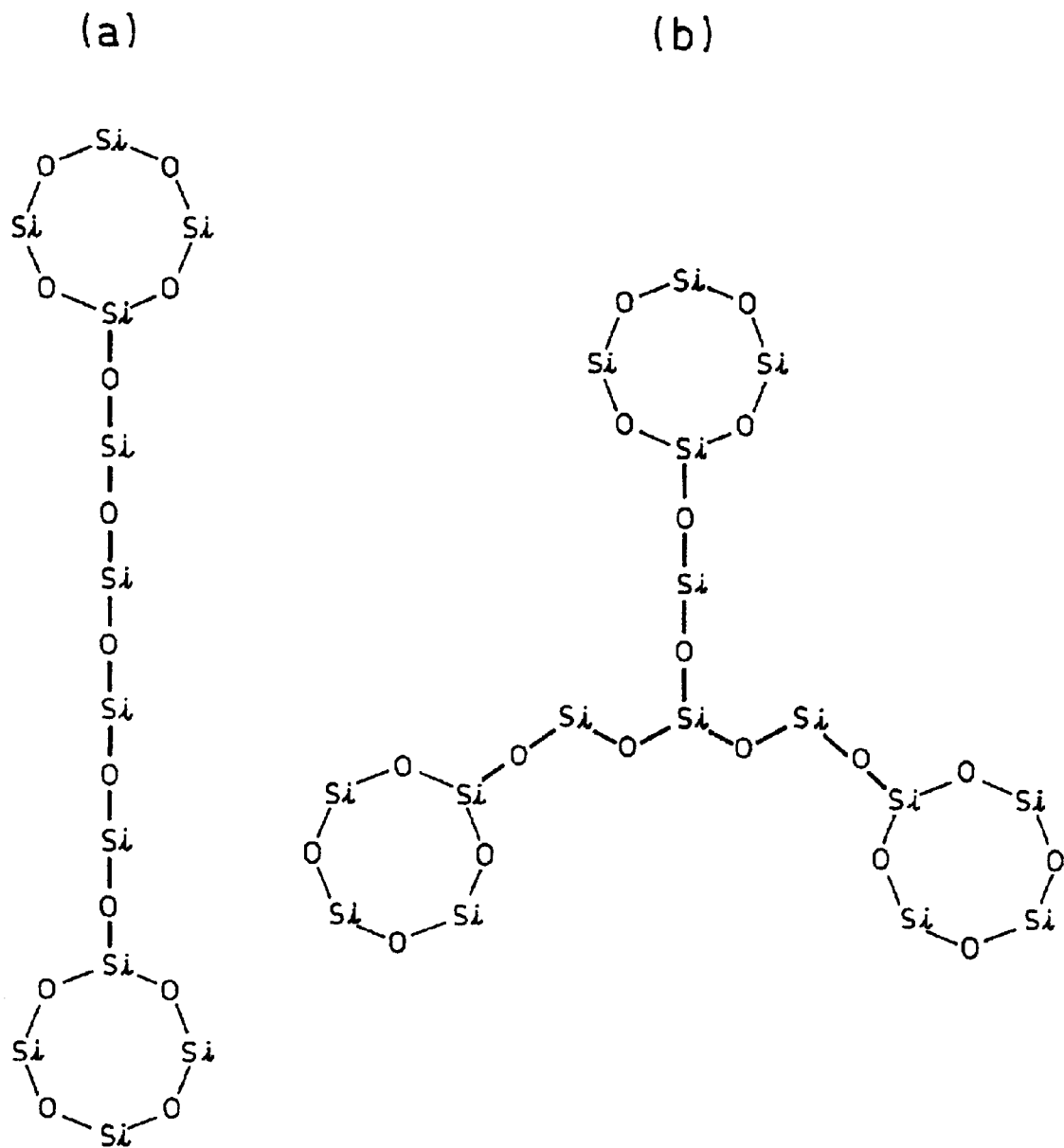
FIG. 6 is a pair of sketches showing specific examples of molecular structure (3). The specific examples of molecular structure (3) are indicated by bold lines.
Figure 7:
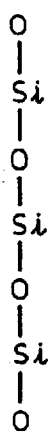
FIG. 7 is a set of sketches showing specific examples of linear structures with uncrosslinked free ends indicated by bold lines.
Figure 7:
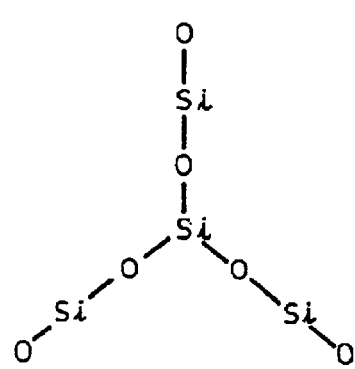
Figure 7:
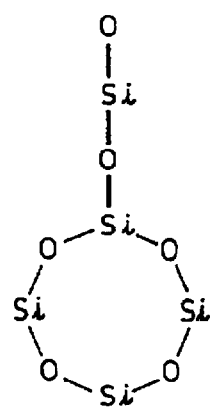
Figure 7:
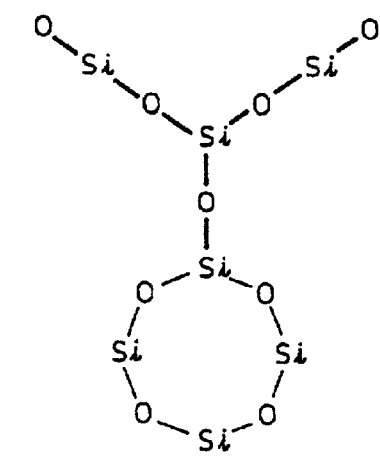
Figure 7:
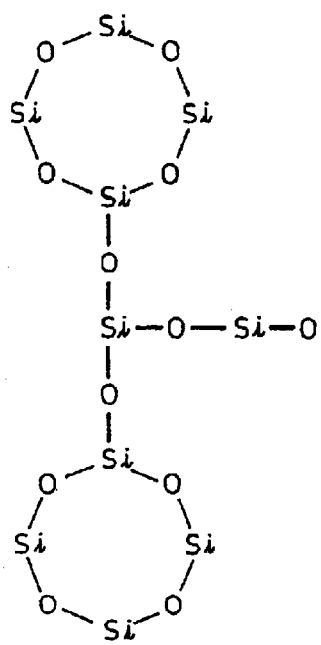
Figure 7:
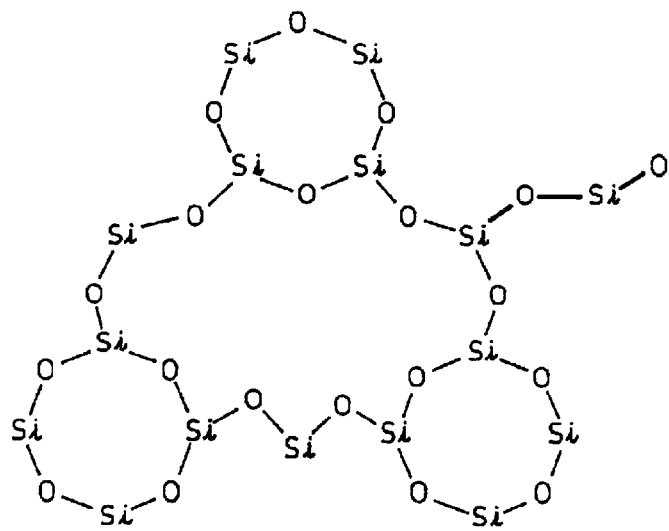

| | Molecular structure | No. of Si atoms | Electronic polarizability [Å³] | Oscillation polarizability [Å³] | Minimum characteristic oscillation frequency [cm⁻¹] |
|---|---|---|---|---|---|
| Invention examples | (1) FIG. 4 | 3 | 5.042 | 3.467 | 29.4 |
| | (1) FIG. 4 | 4 | 5.132 | 4.044 | (20.7) |
| | (1) FIG. 4 | 6 | 5.173 | 4.348 | 24.0 |
| | (1) FIG. 4 | 8 | 5.197 | 4.661 | 24.1 |
| | (2) FIG. 5(a) | 8 | 4.589 | 4.114 | 22.7 |
| | (2) FIG. 5(d) | 8 | 4.001 | 4.014 | (54.0) |
| | (3) FIG. 6(a) | 12 | 5.058 | 4.909 | 1.1 |
| Comp. examples | FIG. 7(a) | 3 | 5.276 | 29.00 | 7.5 |
| | FIG. 7(a) | 4 | 5.278 | 15.86 | 5.4 |
| | FIG. 7(a) | 6 | 5.300 | 11.68 | 3.4 |
| | FIG. 7(a) | 6 | 5.239 | 25.87 | 2.6 |
| | FIG. 7(a) | 8 | 5.251 | 27.02 | 1.8 |
| | FIG. 7(a) | 10 | 5.276 | 11.47 | 3.0 |
| | FIG. 7(a) | 10 | 5.232 | 7.889 | 6.9 |
| | FIG. 7(a) | 12 | 5.239 | 8.034 | 5.9 |
| | FIG. 7(a) | 16 | 5.238 | 8.063 | 2.1 |

When the number of Si atom in the molecule in FIG. 7(a) is 6 or 10, calculated results are shown for two different conformations. The characteristic oscillation frequencies in parentheses indicate cases where the characteristic oscillation is infrared inactive and does not contribute to the oscillation polarizability.

Figure 8:
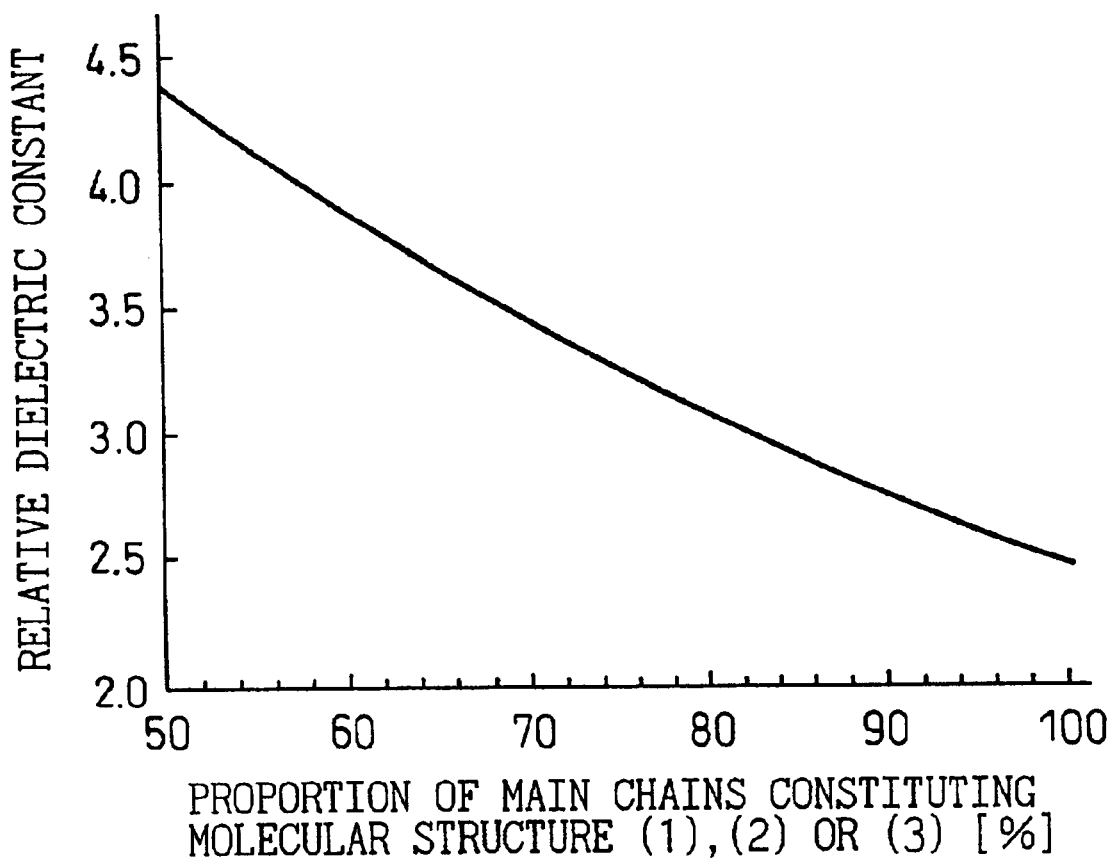
FIG. 8 is a graph showing the relationship between dielectric constant and the proportion of main chains composing molecular structures (1), (2) or (3).
Figure 9:
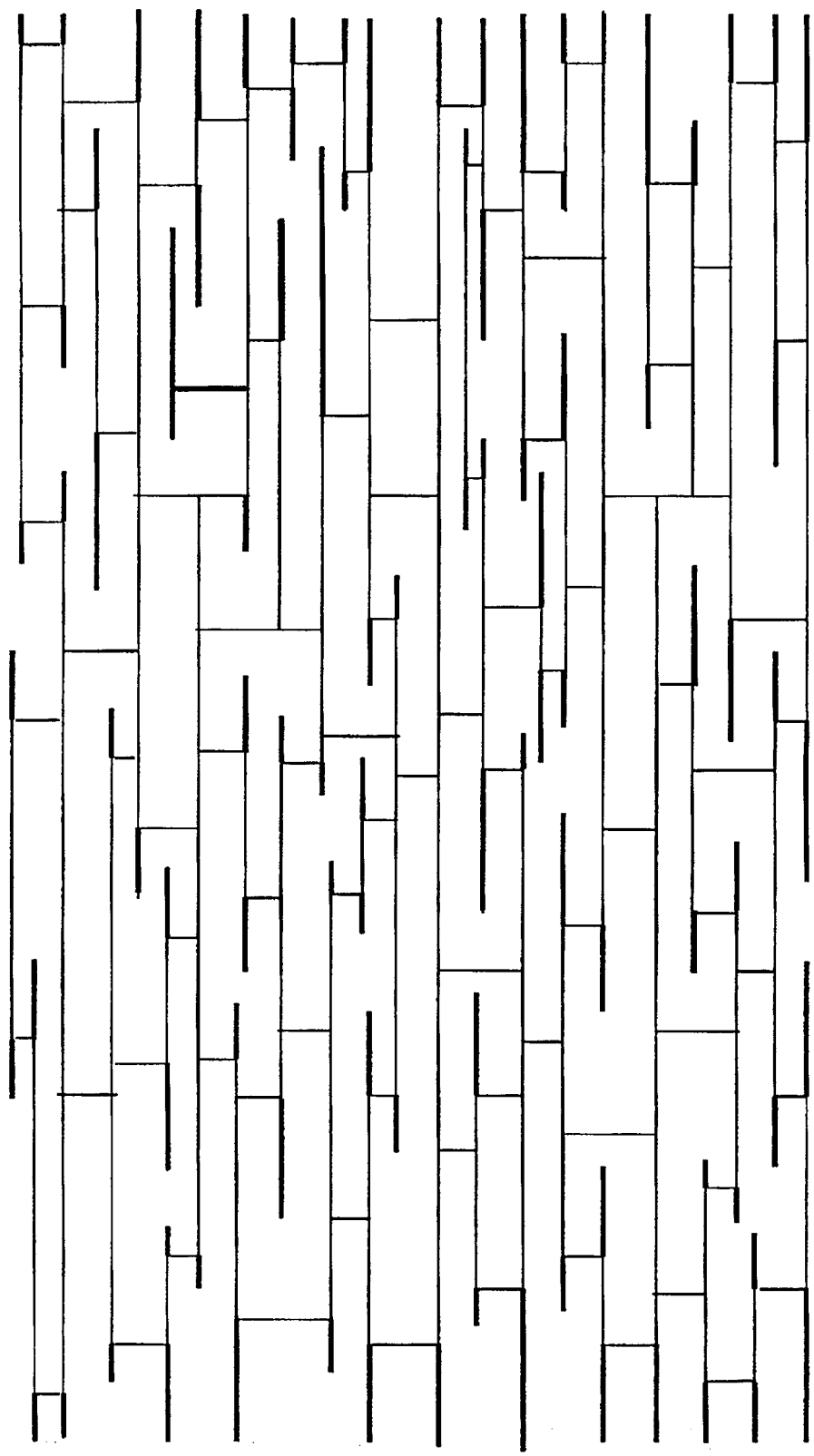
FIG. 9 is an illustrative sketch of a main chain skeleton in a polymeric crosslinked material.

Equation (1) was used to plot the relationship between the proportion of main chains of molecular structure (1), (2) or (3) and the relative dielectric constant, yielding the relationship shown in FIG. 8. The values used for the polarizability (electron polarization+oscillation polarization) were the averages of the calculated values listed in Table 1, assuming a material density of 1.07 g/cm³. That is, 9.0 was used as the polarizability of molecular structures (1), (2) and (3), and 20.0 was used as the polarizability for a linear structure with ends. Based on FIG. 8 when at least 80% of the main chains have structures according to molecular structure (1), (2) or (3) the relative dielectric constant is less than 3.0.

A method will now be described for actual synthesis of materials including ringed, ladder-like or polyhedral molecular structures. A material according to the invention may be synthesized, for example, from a starting material represented by $R^1R^1Si(OR^2)_2$ (where $R^1$ and $R^2$ are alkyl groups) and a metal alkoxide. When $R^1R^1Si(OR^2)_2$ is mixed at a 3- to 20-fold molar ratio with respect to the metal alkoxide and the mixture subjected to hydrolysis, the reaction between the $R^1R^1Si(OR^2)_2$ and the metal alkoxide is accompanied by polymerization between the $R^1R^1Si(OR^2)_2$ groups, and this results in synthesis of a material including molecular structure (1), (2) or (3).

When an alkoxide is used to fabricate a low dielectric constant material according to the invention, the alkoxide used is not particularly restricted, and for example methoxides, ethoxides, propoxides, butoxides, etc. may be mentioned. Some of the alkoxide groups may be alkoxide derivatives substituted with β-diketones, β-ketoesters, alkanolamines, alkylalkanolamines or organic acids.

The hydrolysis of the invention is carried out by adding less than a 2-fold molar amount of water with respect to the total alkoxides, in order to inhibit sudden acceleration of gelation. Here, an inorganic acid, organic acid or both may be used as the catalyst. The hydrolysis reaction may also be controlled by adjustment of the pH of the solution with alkali. The water added may also be diluted with an organic solvent such as an alcohol.

For the hydrolysis there are used a Si starting material such as a siloxane polymer or an alkylalkoxysilane, and an organic solvent that can evenly disperse and dissolve metal alkoxides. Examples include alcohols such as methanol, ethanol, propanol, butanol, etc. and acetone, toluene, xylylene, etc.

After the hydrolysis, the alcohol, etc. which was used as the solvent or which was produced by the hydrolysis is distilled off at normal pressure or under reduced pressure.

For an insulating film where a low dielectric constant material according to the invention is used between layers of an LSI element, the coating onto the substrate may be accomplished by spray coating, dip coating, spin coating or the like.

When used as a low dielectric constant substrate in a bulk material, it is cast into a mold, shaped and heat treated.

The heat treatment for coated films and bulk materials is carried out at 70–500° C. At below 70° C. the solvent, etc. will not evaporate sufficiently and solidification will not be possible. At above 500° C. the organic components will begin to decompose.

This low dielectric constant material of the invention can be applied to various electronic parts such as LSI element interlayer insulating films and IC boards.

The insulating film of the invention will now be explained in greater detail by way of the following examples. The invention, however, is in no way limited to these examples alone.

The materials of the examples and comparative examples were synthesized from Si materials such as dialkylalkoxysilanes and siloxane polymers, and metal alkoxide crosslinking agents. The metal alkoxides used were $Al(O-sec-C_4H_9)_3$, $Si(OC_2H_5)_4$, $Ti(OC_2H_5)_4$ and $Ta(OC_2H_5)_5$. The Al, Ti and Ta alkoxides used were chemically modified with ethyl acetoacetate.

TABLE 2

| | Group | Metal | Storage elastic modulus [MPa] | Relative dielectric constant |
|---|---|---|---|---|
| Invention Examples | Example 3 | Al | 11.5 | 2.6 |
| | Example 4 | Si | 25.2 | 2.6 |
| | Example 5 | Ti | 50.5 | 2.7 |
| | Example 6 | Ta | 85.1 | 2.9 |
| Comp. Examples | Comp. Ex. 2 | Al | 2.1 | 3.3 |
| | Comp. Ex. 3 | Si | 11.2 | 3.3 |
| | Comp. Ex. 4 | Ti | 12.5 | 3.5 |
| | Comp. Ex. 5 | Ta | 45.0 | 3.7 |

Examples 3–6 were fabricated with dimethyldiethoxysilane and the metal alkoxides listed in Table 2 as the starting materials. The ratio of the metal alkoxide to the dimethyldiethoxysilane was 1:10 in Example 3, 1:5 in Example 4, 1:10 in Example 5 and 1:20 in Example 6. These were stirred in an ethanol solvent, and a solution of water in ethanol was added for hydrolysis to prepare a sol. The resulting sol was poured into an aluminum dish and subjected to two-stage heat treatment at 70° C. and 150° C. to fabricate a bulk material. The dynamic viscoelasticity of the bulk material was measured under conditions of room temperature, 110 Hz frequency to determine the storage elastic modulus. An electrode was also connected to both sides of the bulk material to measure the dielectric constant at a frequency of 1 MHz.

Comparative Examples 2–5 were fabricated with a siloxane polymer represented by $HO-[Si(CH_3)_2-O]_{40}-H$ and the metal alkoxides listed in Table 2 as the starting materials.

The ratio of the metal alkoxide to the siloxane polymer was 4:1 in Comparative Example 2, 2:1 in Comparative Example 3, 4:1 in Comparative Example 4 and 3:1 in Comparative Example 5. These were stirred in an ethanol solvent, and a solution of water in ethanol was added for hydrolysis to prepare a sol. The resulting sol was poured into an aluminum dish and subjected to two-stage heat treatment at 70° C. and 150° C. to fabricate a bulk material. The dynamic viscoelasticity of the bulk material was measured under conditions of room temperature, 110 Hz frequency to determine the storage elastic modulus. An electrode was also connected to both sides of the bulk material to measure the dielectric constant at a frequency of 1 MHz.

As a result of measuring the Raman spectra of the samples of Examples 3–6 and Comparative Examples 2–5, a peak was observed at 605 cm$^{-1}$ in Examples 3–6, but no such peak was observed in Comparative Examples 2–5. A peak at 605 cm$^{-1}$ corresponds to three-membered rings of Si—O (F. L. Galeener, Solid State Commun. 44, 1037 (1982)). Four-membered rings are also known to exhibit a peak at near 490 cm$^{-1}$, but since the peak for linear Si—O molecules has roughly the same Raman frequency, the presence of ringed structures of four or more members is difficult to detect based on Raman spectra. However, as shown in Table 2, for all of the metals used the samples of the examples exhibited higher storage elastic moduli than the samples of the comparative examples with the same metals. The differences in storage elastic moduli reflect the differences in structures of the fabricated bulk materials, and these results indicate that the samples of the examples had higher contents of rigid molecular structure units belonging to molecular structures (1) and (2) than the samples of the comparative examples. Table 2 also shows that the materials of the invention had relative dielectric constants of less than 3.0, and lower values than the comparative examples, for all of the metals used.

According to the invention as described above, it is possible to obtain low dielectric constant materials with relative dielectric constants of less than 3.0. By applying these low dielectric constant materials to semiconductor elements and electrical circuit parts, including LSI interlayer insulating films, IC boards and the like, it is possible to reduce electrical signal delay and thus adapt to higher speeds for devices.

For synthesis of insulating materials comprising both inorganic and organic components, it is common to adopt a method of hydrolyzing alkoxysilanes, siloxane polymers, metal alkoxides, etc. and accomplishing polymerization by dehydration reaction, and FIG. 8 is a sketch of the main chain skeleton in a material synthesized in this manner. The entire main chain skeleton is divided into partial structures with ends, indicated by bold lines, and the remaining partial structures having no ends (ring structures, etc.). Alkoxysilanes and siloxane polymers generally have lower reactivity than metal alkoxide crosslinking agents, and therefore most of the ends are believed to be SiOH (silanol) groups produced by hydrolysis.

The linear structure represented by the following structural formula I (where R is OH) is considered as a model of the partial structures with ends, and the ringed molecule represented by the following structural formula II is considered as a model of the partial structures with no ends; the polarizabilities of each were calculated by the molecular orbital method.

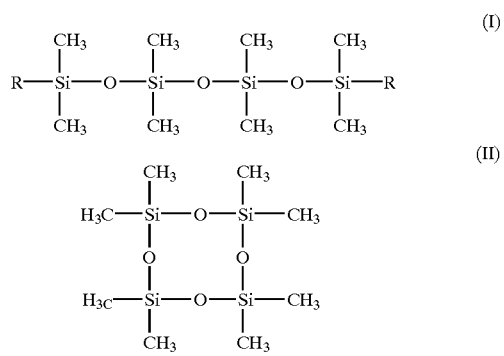

The results are shown in Table 3 ((g) and (k)).

TABLE 3

| Molecular structure | Terminal substituent (R) | Electronic polarizability [Å$^3$] | Oscillation polarizability [Å$^3$] | Polarizability [Å$^3$] |
|---|---|---|---|---|
| (a) Formula I | CH$_3$ | 22.78 | 18.32 | 41.10 |
| (b) Formula I | CH$_2$CH$_3$ | 25.29 | 17.72 | 43.01 |
| (c) Formula I | H | 20.71 | 21.40 | 42.11 |
| (d) Formula I | BH$_2$ | 24.37 | 27.15 | 51.52 |
| (e) Formula I | B(CH$_3$)$_2$ | 29.58 | 21.78 | 51.36 |
| (f) Formula I | AlH$_2$ | 29.68 | 19.86 | 49.54 |
| (g) Formula I | OH | 21.11 | 64.88 | 85.99 |
| (h) Formula I | OCH$_3$ | 24.17 | 53.78 | 77.95 |
| (i) Formula I | CF$_3$ | 23.62 | 54.04 | 77.66 |
| (j) Formula I | F | 20.18 | 60.81 | 80.99 |
| (k) Formula II | none | 20.53 | 16.17 | 36.70 |

The electronic polarizabilities were almost the same values, but the oscillation polarizabilities of the linear molecules were about 4 times those of the ringed molecules. Analysis based on the oscillation polarizabilities of the linear molecules (Equation 2) indicates that the maximum contribution was at the minimum normal oscillation (frequency: 5.2 cm$^{-1}$). As shown by the following structural formula III (where the methyl groups of the side chains are omitted),

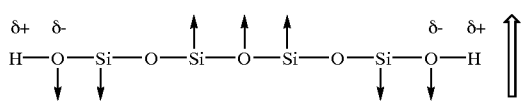

With this normal oscillation, the oxygen atoms of the negatively charged OH groups experience large displacement with respect to the positively charged hydrogen atoms. Consequently, the change in the dipole moment is large in the direction indicated in structural formula III, which results in an increase in the oscillation polarization. Such normal oscillation at low frequencies where the end portions undergo relatively large displacement has been confirmed for polyacetylene (J. Chem. Phys., 104, 4125 (1996)), polyethylene (J. Chem. Soc. Faraday Trans., 91, 1641 (1995)) and other polymers, and is believed to be a common feature of linear polymers.

This analysis suggests that reducing the polarity of terminal substituents to inhibit oscillation polarization is effective for lowering the dielectric constant of polymer materials. In the various terminal substituents R shown in the following structural formulas IV, the differences in electronegativities between the bonding atoms in the Si—R portions are shown (Pauling values: from Chemistry Handbook (Maruzen, 1990)). A smaller difference is believed to indicate a smaller polarity of the bond.

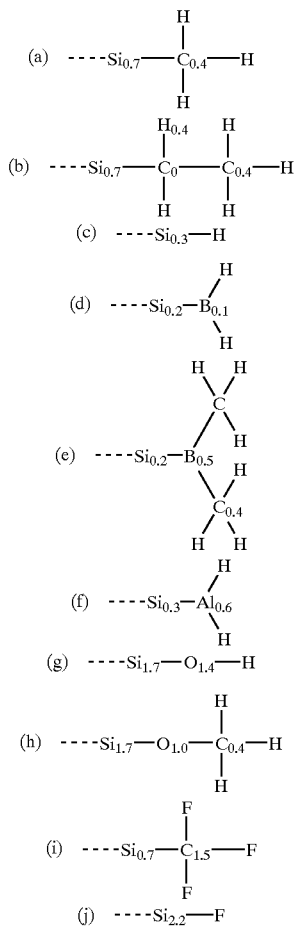

Table 3 also shows the calculated values for the polarizabilities corresponding to the model molecules of formula I having these terminal substituents. As is clearly seen from the formulas IV and Table 3, in the case of the substituents (a)–(f) where the bonding atom pairs of the terminal Si—R portion have an electronegativity difference of 0.7 or less, the oscillation polarizabilities were low values of ½ to ⅓ compared to (g)–(j) which include bonds where those values exceed 0.7.

For actual removal of the OH groups in the material, for example, the fabricated material may be immersed in a solution in which $R^1_3SiOR^2$ ($R^1$ and $R^2$ are alkyl groups), etc. has been hydrolyzed, and for efficient reaction between the SiOH groups and the $R^1_3SiOH$, it may be exposed to ultraviolet rays in a wavelength range of 115–400 nm to promote dehydrating condensation by light energy to produce Si—O—SiR$^1_3$.

The low dielectric constant material of the invention can be applied in various electronic parts, such as LSI element interlayer insulating films, IC boards, and the like.

This low dielectric constant material of the invention will now be explained more concretely by way of the following calculation examples and examples. The invention, however, is in no way limited to these examples alone.

Calculation Examples 1–6 and Calculation Example 7 are examples where the dielectric constants of materials were calculated according to Equation 1, based on the polariz-abilities of the model molecules shown in Table 3. The proportion of the end-containing portions to end-free portions (for example, ring structures) among all of the polymer chains composing each material is designated as x:(1-x), (0≦x≦1). The proportion of molecules with end structures of —O—Si(CH$_3$)$_2$R (R is a group other than OH) to those with —O—Si(CH$_3$)$_2$OH is designated as y:(1-y), (0≦y≦1). Thus, Equation 1 is represented by:

$$\frac{\varepsilon-1}{\varepsilon+2} = \frac{4\pi\rho N_A}{3} \frac{xy\alpha_R + x(1-y)\alpha_{OH} + (1-x)\alpha'}{xyW_R + x(1-y)W_{OH} + (1-x)W'} \quad 3$$

Here, $\alpha_R$ is the polarizability of linear molecules wherein the end groups R shown in FIG. 8 are not OH, $\alpha_{OH}$ is the polarizability particularly where the end groups are OH, $\alpha'$ is the polarizability of the ringed molecules shown in FIG. 8, and $W_R$, $W_{OH}$ and W' are the molecular weights of their model molecules. The calculated values of Table 3 were used for the polarizabilities to calculate the dielectric constants by assuming a density $\rho$ of 1.07 g/cm$^3$. The results are shown in Table 4.

TABLE 4

| Group | R | x | y | Dielectric constant |
|---|---|---|---|---|
| Calc. Ex. 1 | CH$_3$ | 0.3 | 0.3 | 3.2 |
|  | CH$_3$ | 0.3 | 0.6 | 2.9 |
|  | CH$_3$ | 0.3 | 0.7 | 2.8 |
|  | CH$_3$ | 0.3 | 0.8 | 2.7 |
|  | CH$_3$ | 0.3 | 0.9 | 2.6 |
|  | CH$_3$ | 0.3 | 1.0 | 2.6 |
| Calc. Ex. 2 | CH$_2$CH$_3$ | 0.3 | 0.3 | 3.2 |
|  | CH$_2$CH$_3$ | 0.3 | 0.6 | 2.9 |
|  | CH$_2$CH$_3$ | 0.3 | 0.7 | 2.8 |
|  | CH$_2$CH$_3$ | 0.3 | 0.8 | 2.7 |
|  | CH$_2$CH$_3$ | 0.3 | 0.9 | 2.6 |
|  | CH$_2$CH$_3$ | 0.3 | 1.0 | 2.5 |
| Calc. Ex. 3 | H | 0.3 | 0.3 | 3.3 |
|  | H | 0.3 | 0.6 | 3.0 |
|  | H | 0.3 | 0.7 | 2.9 |
|  | H | 0.3 | 0.8 | 2.8 |
|  | H | 0.3 | 0.9 | 2.7 |
|  | H | 0.3 | 1.0 | 2.6 |
| Calc. Ex. 4 | BH$_2$ | 0.3 | 0.3 | 3.3 |
|  | BH$_2$ | 0.3 | 0.6 | 3.1 |
|  | BH$_2$ | 0.3 | 0.7 | 3.0 |
|  | BH$_2$ | 0.3 | 0.8 | 2.9 |
|  | BH$_2$ | 0.3 | 0.9 | 2.8 |
|  | BH$_2$ | 0.3 | 1.0 | 2.8 |
| Calc. Ex. 5 | B(CH$_3$)$_2$ | 0.3 | 0.3 | 3.2 |
|  | B(CH$_3$)$_2$ | 0.3 | 0.6 | 3.0 |
|  | B(CH$_3$)$_2$ | 0.3 | 0.7 | 2.9 |
|  | B(CH$_3$)$_2$ | 0.3 | 0.8 | 2.8 |
|  | B(CH$_3$)$_2$ | 0.3 | 0.9 | 2.7 |
|  | B(CH$_3$)$_2$ | 0.3 | 1.0 | 2.6 |
| Calc. Ex. 6 | AlH$_2$ | 0.3 | 0.3 | 3.3 |
|  | AlH$_2$ | 0.3 | 0.6 | 3.0 |
|  | AlH$_2$ | 0.3 | 0.7 | 2.9 |
|  | AlH$_2$ | 0.3 | 0.8 | 2.8 |
|  | AlH$_2$ | 0.3 | 0.9 | 2.7 |
|  | AlH$_2$ | 0.3 | 1.0 | 2.6 |
| Calc. Ex. 7 | OH | 0.3 | 0.0 | 3.6 |

Calculation Examples 1–6 were materials wherein some of the terminal OH groups were substituted for the substituents R shown in Table 4, and in all cases substitution of at least 80% exhibited a dielectric constant value of less than 3.0. On the other hand, since Calculation Example 7 had OH groups at all of the ends, the dielectric constant was a high value exceeding 3.0.

Actual synthesis examples will now be provided. Examples 7–10 were fabricated using a siloxane polymer represented by HO—[Si(CH$_3$)$_2$—O]$_{40}$—H and the metal alkoxides listed in Table 5 as the starting materials.

TABLE 5

| Group | Metal | Dielectric constant |
|---|---|---|
| Example 7 | Al | 2.6 |
| Example 8 | Si | 2.6 |
| Example 9 | Ti | 2.7 |
| Example 10 | Ta | 2.9 |
| Comp. Ex. 6 | Al | 3.5 |
| Comp. Ex. 7 | Si | 3.5 |
| Comp. Ex. 8 | Ti | 3.6 |
| Comp. Ex. 9 | Ta | 3.8 |

The molar ratio of the metal alkoxide to siloxane polymer was 4:1 in Example 7, 2:1 in Example 8, 4:1 in Example 9 and 3:1 in Example 10. These were stirred in an ethanol solvent, and a solution of water in ethanol was added for hydrolysis to prepare sols. Each resulting sol was poured into an aluminum dish and subjected to two-stage heat treatment at 70° C. and 150° C. to fabricate a sheet sample with a thickness of 0.3 mm. The sheet sample was immersed for one hour in an ethanol solution containing triethylsilanol $(C_2H_5)_3SiOH$. Then, after drying at 70° C. for one hour, it was heat treated at 150° C. for 2 hours with exposure to ultraviolet rays of 254 nm at 1 $W/cm^2$.

Comparative Examples 6–9 were fabricated using a siloxane polymer represented by $HO-[Si(CH_3)_2-O]_{40}-H$ and the metal alkoxides listed in Table 3 as the starting materials. The molar ratio of the metal alkoxide to siloxane polymer was 4:1 in Comparative Example 6, 2:1 in Comparative Example 7, 4:1 in Comparative Example 8 and 3:1 in Comparative Example 9. These were stirred in an ethanol solvent, and a solution of water in ethanol was added for hydrolysis to prepare sols. Each resulting sol was poured into an aluminum dish and subjected to two-stage heat treatment at 70° C. and 150° C. to fabricate sheet samples with a thickness of 0.3 mm.

The samples of Examples 7–10 and Comparative Examples 6–9 were made into powders and allowed to stand at room temperature in a vacuum desiccator for 24 hours to remove the absorbed water, and then the FT-IR spectra were measured. For the samples of Comparative Examples 6–9 there were detected peaks at 3738 and 980 $cm^{-1}$ attributable to free SiOH groups not linked by hydrogen bonding, but no such peaks were observed for the samples of Examples 7–10.

Upon NMR measurement of the Si, peaks were detected at positions D1 (terminal Si corresponding to $-O-Si(CH_3)_2-OH$) and D2 (Si corresponding to $-O-Si(CH_3)_2-O-$) in the samples of Comparative Examples 6–9, but in the samples of Examples 1–4 the D1 peaks were absent and a new peak was detected corresponding to the Si* of $-Si-O-Si^*(C_2H_5)_3$, in addition to the D2 peak.

Table 5 shows the results of measuring the dielectric constant at 1 MHz by attaching an electrode to both sides of each sample. Since the samples of Examples 7–10 had no terminal OH groups, their dielectric constants were low values of 3.0 and below, and since the samples of Comparative Examples 6–9 had residual SiOH groups, their dielectric constants were high values exceeding 3.0.

According to the invention it is possible to obtain low dielectric constant materials with relative dielectric constants of less than 3.0. By applying these low dielectric constant materials to semiconductor elements and electrical circuit parts, including LSI interlayer insulating films, IC boards and the like, it is possible to reduce electrical signal,delay and thus adapt to higher speeds for devices.

The $M(-O-)_n$ according to the invention is a simplified representation of an inorganic polymer with a three-dimensional network structure formed by linked units composed of a metallic element and oxygen. $R^1Si(-O-)_3$ has an alkyl group, aryl group or aralkyl group at one of the four bonding sites of Si, with the remaining sites incorporated in the inorganic polymer via oxygen. $R^2R^3Si(-O-)_2$ is also incorporated in the inorganic polymer via oxygen. $R^1$, $R^2$ and $R^3$ each represent an alkyl group, aryl group or aralkyl group. The alkyl group preferably has a carbon number of 1–20, more preferably 1–12 and even more preferably 1–6. As examples there may be mentioned methyl, ethyl, propyl, butyl, hexyl, 2-ethylhexyl, dodecyl, etc. The aryl group or aralkyl group preferably has a carbon number of 6–20, and more preferably 6–12. As examples there may be mentioned phenyl, tolyl, xylyl, naphthyl, benzyl, etc.

The reason for the low dielectric constant and low moisture absorption achieved according to the invention will now be explained.

The dielectric constant $\in$ of a material is generally represented by the Clausius-Mosotti equation $(\in-1)/(\in+2) = (4\pi/3)\cdot(\rho N_A/M)\cdot\alpha$ (where $\rho$: density, $N_A$: Avogadro's number, M: molecular weight, $\alpha$: polarizability). This equation shows that in order to achieve a low dielectric constant it is effective to reduce the polarizability and increase the molecular volume $M/\rho$. Since the material of the invention includes alkyl groups, aryl groups or aralkyl groups and has a higher bulk and lower density than $SiO_2$ glass, its molecular volume $M/\rho$ is large so that a low dielectric constant is achieved. When CH bonds and CF bonds are compared, the CF bonds that tend not to cause as much polarization as CH bonds are found to have a lower polarizability $\alpha$ and a larger molecular volume, and therefore the dielectric constant can be lowered by substituting CF bonds for CH bonds. Substitution of CF bonds for CH bonds also notably lowers the solubility of water vapor gas into the film, so that virtually no moisture absorption is observed. Since the lack of moisture absorption eliminates the need for insertion of a P-TEOS film, the dielectric constant of the interlayer dielectric as a whole can be lowered.

However, when CF bonds are substituted for CH bonds in alkyl groups, aryl groups and aralkyl groups the reactivity of Si with the alkoxides is reduced due to steric hindrance, and therefore it is essential for CF bonds to be substituted for only a portion of the CH bonds in the alkyl groups, aryl groups and aralkyl groups so that formation of the Si—O—Si skeleton is not hindered, and for formation of the network structure to be promoted by introduction of $M(-O-)_n$.

In the low dielectric constant material of the invention, a particularly good balance can be achieved between the low dielectric constant and low moisture absorption and the network structure by introduction of a group containing F in the form of $CH_3(CH_2)_l(CF_2)_mCF_3Si(-O-)_2$ (where l and m are integers of from 0 to 10) wherein a methyl group and a $(CH_2)_l(CF_2)_mCF_3$ group (where l and m are integers of from 0 to 10) are attached to one Si. As specific groups containing F in this form there may be mentioned $CH_2CH_2F_3$, $CH_2CH_2C_5F_{10}CF_3$, etc.

In the low dielectric constant material of the invention, when the molar ratio of the metal element M of $M(—O—)_n$ with respect to all the metallic elements is from 0.04 to 0.40 it is possible to form a network structure without increased density, and this range is therefore particularly preferred. That is, if the ratio is less than 0.04, formation of the network structure proceeds more slowly so that solidification is hampered, and when the ratio exceeds 0.4 the density increases, thus raising the dielectric constant. Here, "all of the metallic elements" refers to the one or more metal elements selected from among B, Al, Ge, Ti, Y, Zr, Nb and Ta, and also including all of the Si. When the ratio of Si directly bonded to alkyl groups, aryl groups or aralkyl groups wherein CF bonds are substituted for some or all of the CH bonds is 0.15 or greater with respect to the total Si, a particularly notable effect of lower dielectric constant and lower moisture absorption is achieved. If the ratio is greater than 0.6 it becomes more difficult to form the Si—O—Si backbone, and it is therefore no greater than 0.6. The molar ratio of alkyl groups, aryl groups or aralkyl groups with respect to the total Si is preferably from 0.5 to 1.7. If the ratio is 0.5 or greater the alkyl groups, aryl groups or aralkyl groups contribute more effectively to the lower densification and Si—O—Si backbone formation. If the ratio exceeds 1.7, however, there are fewer reaction sites which hampers solidification by formation of the three-dimensional network structure, and a longer time is therefore required for solidification.

The coating solution used to prepare a low dielectric constant according to the invention will now be explained. The starting materials used for the $M(—O—)_n$, $R^1Si(—O—)_3$ and $R^2R^3Si(—O—)_2$ in the low dielectric constant material may be $M(OR^4)_n$, $R^1Si(OR^5)_3$ and $R^2R^3Si(OR^6)_2$, respectively. Also, $R^{"1}Si(OR^7)_3$ and/or $R^2R^{"3}Si(OR^8)_2$ may be used as the starting materials in order to introduce into the low dielectric constant material a structure wherein CF bonds are substituted for some of the CH bonds of $R^1$ and $R^2$ in $R^1Si(—O—)_3$ and $R^2R^3Si(—O—)_2$. Here, $R^1$, $R^2$ and $R^3$ are each an alkyl group, aryl group or aralkyl group, $R^4$, $R^5$, $R^6$, $R^7$ and $R^8$ are each an alkyl group or phenyl group, and $R^{"1}$ and $R^{"3}$ are each an alkyl group, aryl group or aralkyl group wherein CF bonds are substituted for some or all of the CH bonds.

When an alkoxide is used to fabricate the low dielectric constant material of the invention the alkoxide used is not particularly restricted, and as examples there may be mentioned methoxides, ethoxides, propoxides and butoxides. Also, some of the alkoxy groups may be alkoxide derivatives substituted with β-diketones, β-ketoesters, alkanolamines, alkylalkanolamines or organic acids.

In the hydrolysis for the invention, up to a two-fold molar amount of water with respect to the total alkoxy groups may be added for hydrolysis. Here, either an inorganic acid, organic acid or both may be used as a catalyst. The pH of the solution may also be adjusted with an alkali to control the hydrolysis reaction. The water added may be diluted with an organic solvent such as an alcohol. It is not preferred to use more than a two-fold molar amount of water, because this will result in immediate gelation.

For the hydrolysis there are used a Si starting material such as an alkylalkoxysilane and an organic solvent that can evenly disperse and dissolve metal alkoxides. Examples include alcohols such as methanol, ethanol, propanol, butanol, etc. and acetone, toluene, xylylene, etc.

After the hydrolysis, the alcohol, etc. which was used as the solvent or which was produced by the hydrolysis may be distilled off at normal pressure or under reduced pressure prior to coating. For use as an LSI interlayer insulating film, the coating onto the substrate may be accomplished by spray coating, dip coating, spin coating or the like.

The heat treatment for the coated film is carried out at 70–500° C. in air, $N_2$ or Ar. At below 70° C. the solvent, etc. will not evaporate sufficiently and solidification will not be possible. At above 500° C. the organic components will begin to decompose. When heat treatment is carried out at 70–500° C. in air, $N_2$ or Ar, the organic groups or hydrogen bonded to the Si in the starting material retain their bonds while present in the film. The Si coordination is therefore identical in the starting material and in the film.

This insulating film according to the invention can be applied to semiconductor devices and various electronic parts, including LSI element interlayer insulating films.

The low dielectric constant material of the invention will now be explained in greater detail by way of the following examples.

Table 6 shows the starting materials in the examples of the invention and comparative examples, the molar ratios of the starting material mixtures, the molar ratios of M in $M(—O—)_n$ with respect to the total metal elements (M/(Si+M)), the molar ratios of Si directly bonded to alkyl groups, aryl groups or aralkyl groups wherein CF bonds are substituted for some or all of the CH bonds with respect to the total Si(Si(F)/Si), the molar ratio of alkyl groups, aryl groups or aralkyl groups with respect to the total Si(R/Si), and dielectric constants of the fabricated samples in air and in vacuum.

The method of synthesizing the samples fabricated in the examples and comparative examples will now be described. First, metal alkoxides of Ti and Al were stabilized by mixture with two-fold molar amounts of ethyl acetoacetate at room temperature. Next, the Si starting materials and the stabilized metal alkoxides were placed in an ethanol solution in prescribed molar ratios and stirred with a stirrer for 30 minutes. Water was then added in an equimolar amount with respect to the total alkoxy groups, and stirring was continued for 30 minutes. In Examples 2 and 3 and Comparative Example 5, a 1 N aqueous hydrochloric acid solution was added instead of water prior to stirring for 30 minutes. The substrate used was a Si wafer coated with films of Ti to 50 nm and Pt to 100 nm, and the prepared solutions were applied with a spin coater and heat-treated. The heat-treatment was carried out continuously with a hot plate at 80° C., 150° C. and 200° C. for one minute at each temperature, and then at 400° C. for 30 minutes. The thicknesses of the resulting insulating films were about 600 nm. After the heat treatment, an Al electrode with a 1 mm diameter was attached as an upper electrode and the dielectric constant was measured with an impedance analyzer. A difference in the dielectric constants in air and in vacuum suggests that moisture is absorbed by the film in air. Since the dielectric constant of a film is generally 4 or lower while the dielectric constant of water is 80 at 20° C., even slight absorption has a large effect on the dielectric constant, and can thus serve as an indicator for evaluation of trace moisture absorption.

TABLE 6

|  |  | Starting materials | Molar ratio | M/(Si + M) | Si(F)/Si | R/Si | Dielectric constant Air | Dielectric constant Vacuum |
|---|---|---|---|---|---|---|---|---|
| Example | 11 | $CH_3C_2H_4CF_3Si(OCH_3)_2$ | 0.3 | 0.1 | 0.33 | 1.33 | 2.7 | 2.7 |
|  |  | $CH_3Si(OCH_3)_3$ | 0.6 |  |  |  |  |  |
|  |  | $Ti(OC_2H_5)_4$ | 0.1 |  |  |  |  |  |
|  | 12 | $CH_3C_2H_4CF_3Si(OC_2H_5)_2$ | 0.1 | 0.2 | 0.125 | 1.375 | 2.8 | 2.7 |
|  |  | $(CH_3)_2Si(OC_2H_5)_2$ | 0.2 |  |  |  |  |  |
|  |  | $C_6H_5Si(OC_2H_5)_3$ | 0.5 |  |  |  |  |  |
|  |  | $Al(OC_4H_9)_3$ | 0.2 |  |  |  |  |  |
|  | 13 | $(CH_3)_2Si(OC_2H_5)_2$ | 0.2 | 0.1 | 0.4 | 1.1 | 2.9 | 2.9 |
|  |  | $C_2H_4CF_3Si(OC_2H_5)_3$ | 0.4 |  |  |  |  |  |
|  |  | $C_2H_5Si(OC_2H_5)_3$ | 0.3 |  |  |  |  |  |
|  |  | $Si(OC_2H_5)_4$ | 0.1 |  |  |  |  |  |
| Comp. Ex. | 10 | $(CH_3)_2Si(OCH_3)_2$ | 0.3 | 0.1 | 0 | 1.33 | 3.4 | 3.0 |
|  |  | $CH_3Si(OCH_3)_3$ | 0.6 |  |  |  |  |  |
|  |  | $Ti(OC_2H_5)_4$ | 0.1 |  |  |  |  |  |
|  | 11 | $HCH_3Si(OC_2H_5)_2$ | 0.4 | 0.6 | 0 | 0.5 | 4.2 | 4.1 |
|  |  | $Si(OC_2H_5)_4$ | 0.4 |  |  |  |  |  |
|  |  | $Al(OC_4H_9)_3$ | 0.2 |  |  |  |  |  |

In Examples 11–13 it was possible to obtain thin films with low dielectric constants of less than 3.0 and very low moisture absorption. In Example 11 in particular, using $CH_3C_2H_4CF_3Si(OCH_3)_2$ and $CH_3Si(OCH_3)_3$ as the main components provided both a low dielectric constant of 2.7 and low moisture absorption. Example 12 had a small Si(F)/Si ratio and thus a somewhat lesser effect of lower moisture absorption by CF bonds and a difference of 0.1 between the dielectric constants in air and vacuum, but the dielectric constants and moisture resistance were superior to the conventional materials of the comparative examples. Example 13 had a small R/Si ratio and thus a somewhat higher dielectric constant than the other examples, but it was less than 3.0 which was a sufficiently practical value, while the moisture absorption was also low.

Comparative Example 10 contained no alkyl groups, aryl groups or aralkyl groups with CF bonds substituting for some or all of the CH bonds, and therefore the dielectric constant in air was higher than in a vacuum, and moisture was absorbed in the film. For this film to be applied in a device it would be necessary to attach a P-TEOS film to at least the top side of the SOG film to prevent moisture absorption. It is possible to accomplish degassing in a vacuum when forming the film by plasma CVD, so that the dielectric constant of the SOG film is a low value (3.0) as measured in a vacuum, but since the dielectric constant of the P-TEOS film attached to prevent moisture absorption is 4, the dielectric constant of the resulting interlayer insulating film will be higher than 3.0. Even the value of 3.0 measured in a vacuum is high compared to Example 11. Comparative Example 11 had low moisture absorption, but a high dielectric constant because of the low proportion of alkyl groups, aryl groups and aralkyl groups.

According to the invention as described above, there may be obtained low dielectric constant materials with a relative dielectric constant of less than 3.0, as well as low moisture absorption. Since electrical signal delay will be reduced if these low dielectric constant materials are applied as interlayer insulating films for LSIs in semiconductor elements and electric circuit parts, they are suitable for achieving higher device speeds.

The $M(—O—)_n$ and $Si(—O—)_4$ according to the invention are simplified representations of inorganic polymers with three-dimensional network structures formed by linkage of units composed of metal elements and oxygen. $R^1Si(—O—)_3$ has an alkyl group, aryl group or aralkyl group at one of the four bonding sites of Si, with the remaining sites incorporated in the inorganic polymer via oxygen. $R^2R^3Si(—O—)_2$ is also incorporated in the inorganic polymer via oxygen.

The reason for the low dielectric constant achieved according to the invention will now be explained.

The dielectric constant $\in$ of a material is generally represented by the Clausius-Mosotti equation $(\in-1)/(\in+2) = (4\rho/3) \cdot (\rho N_A/M) \cdot \alpha$ (where $\rho$: density, $N_A$: Avogadro's number, M: molecular weight, $\alpha$: polarizability). Since the material of the invention exhibits no orientation at a high frequency range of 1 MHz or higher, the electron polarization and atomic polarization may be considered as the polarizations governing the dielectric constant. This equation shows that in order to achieve a low dielectric constant it is effective to reduce the density and polarizability. Since the material of the invention includes alkyl groups, aryl groups or aralkyl groups and has a higher bulk and lower density than $SiO_2$ glass, a low dielectric constant is achieved. When R—Si bonds (where R is an alkyl group, aryl group or aralkyl group) and H—Si bonds are compared, they are found to have the same oscillation polarizability, while H—Si bonds have a notably lower electronic polarizability. Thus, if H can be substituted for R in R—Si while maintaining low density, it will be possible to lower the dielectric constant. For this purpose it is necessary to substitute H for only some of the R of R—Si. The low dielectric constant material of the invention can be synthesized by hydrolysis of a metal salt, metal alkoxide, alkoxysilane, halogenated silane or the like, but when Si alone is included as the inorganic component, the highly polarizable SiOH groups produced during the synthesis procedure tend to remain due to their low reactivity. However, if metals with high reactivity even after hydrolysis, such as B, Al, Ge, Ti, Y, Zr, Nb and Ta are included as metal elements in addition to Si, the remaining SiOH groups can be reduced.

$R^1$, $R^2$ and $R^3$ each represent an alkyl group, aryl group or aralkyl group. The alkyl group preferably has a carbon number of 1–20, more preferably 1–12 and even more preferably 1–6. As examples there may be mentioned methyl, ethyl, propyl, butyl, hexyl, 2-ethylhexyl, dodecyl, etc. The aryl group or aralkyl group preferably has a carbon number of 6–20, and more preferably 6–12. As examples there may be mentioned phenyl, tolyl, xylyl, naphthyl, benzyl, etc.

In the low dielectric constant material of the invention, a particularly good balance can be achieved between low density and low polarizability by introduction of H in the form of $HCH_3Si(-O-)_2$ with one hydrogen and one methyl group per Si, for a greater effect of lowering the dielectric constant.

When the molar ratio of Si with respect to the total metal elements is from 0.57 to 0.95 in the low dielectric constant material of the invention, the SiOH groups can be reduced without notably increasing the electron polarization due to metal elements other than Si, and therefore this range is particularly preferred. Here, "total metal elements" refers to the one or more metal elements selected from among B, Al, Ge, Ti, Y, Zr, Nb and Ta, and also including all of the Si. When the ratio of Si directly bonded to H is 0.3 or greater with respect to the total Si, a particularly notable effect of a lower dielectric constant is achieved. The molar ratio of alkyl groups, aryl groups or aralkyl groups with respect to the total Si is preferably from 0.5 to 1.7. If the ratio is 0.5 or greater the alkyl groups, aryl groups or aralkyl groups contribute more effectively to the lower densification. If the ratio exceeds 1.7, however, there are fewer reaction sites which hampers solidification by formation of the three-dimensional network structure, and a longer time is therefore required for solidification.

When an alkoxide is used to fabricate a low dielectric constant material according to the invention, the alkoxide used is not particularly restricted, and for example methoxides, ethoxides, propoxides, butoxides, etc. may be mentioned. Some of the alkoxide groups may be alkoxide derivatives substituted with β-diketones, β-ketoesters, alkanolamines, alkylalkanolamines or organic acids.

In the hydrolysis for the invention, up to a two-fold molar amount of water with respect to the total alkoxy groups may be added for hydrolysis. Here, either an inorganic acid, organic acid or both may be used as a catalyst. The pH of the solution may also be adjusted with an alkali to control the hydrolysis reaction. The water added may be diluted with an organic solvent such as an alcohol. It is not preferred to use more than a two-fold molar amount of water, because this will result in immediate gelation.

For the hydrolysis there are used a Si starting material such as a siloxane polymer or an alkylalkoxysilane, and an organic solvent that can evenly disperse and dissolve metal alkoxides. Examples include alcohols such as methanol, ethanol, propanol, butanol, etc. and acetone, toluene, xylylene, etc.

After the hydrolysis, the alcohol, etc. which was used as the solvent or which was produced by the hydrolysis is distilled off at normal pressure or under reduced pressure, prior to coating.

For use as an LSI interlayer insulating film, the coating onto the substrate may be accomplished by spray coating, dip coating, spin coating or the like.

When used as a low dielectric constant substrate in a bulk material, it is cast into a mold, shaped and heat treated.

The heat treatment for coated films and bulk materials is carried out at 70–500° C. in air, $N_2$ or Ar. At below 70° C. the solvent, etc. will not evaporate sufficiently and solidification will not be possible. At above 500° C. the organic components will begin to decompose. When heat treatment is carried out at 70–500° C. in air, $N_2$ or Ar, the organic groups or hydrogen bonded to the Si in the starting material retain their bonds while present in the film or bulk material. The Si coordination is therefore identical in the starting material and in the film or bulk material.

This insulating film according to the invention can be applied to various electronic parts, including LSI element interlayer insulating films, IC chips and the like.

The low dielectric constant material of the invention will now be explained in greater detail by way of the following examples.

Table 7 shows the starting materials in the examples of the invention and comparative examples, the molar ratios of the starting material mixtures, the molar ratios of Si with respect to the total metal elements (Si/(Si+M)), the molar ratios of Si directly bonded to hydrogen with respect to the total Si(Si(H)/Si), the molar ratio of alkyl groups, aryl groups or aralkyl groups with respect to the total Si(R/Si), and the dielectric constants of the fabricated samples.

TABLE 7

| | | Starting materials | Molar ratio | Si/(Si + M) | Si(H)/Si | R/Si | Dielectric constant |
|---|---|---|---|---|---|---|---|
| Example | 14 | $HSi(OCH_3)_3$ | 0.4 | 0.8 | 0.5 | 1 | 2.5 |
| | | $(CH_3)_2Si(OCH_3)_2$ | 0.4 | | | | |
| | | $Ti(OC_2H_5)_4$ | 0.2 | | | | |
| | 15 | $HCH_3Si(OC_2H_5)_2$ | 0.8 | 0.8 | 1.0 | 1 | 2.4 |
| | | $Ti(OC_2H_5)_4$ | 0.2 | | | | |
| | 16 | $HSi(OC_2H_5)_3$ | 0.3 | 0.7 | 0.43 | 0.57 | 2.6 |
| | | $CH_3Si(OC_2H_5)_3$ | 0.4 | | | | |
| | | $Al(OC_4H_9)_3$ | 0.3 | | | | |
| | 17 | $HCH_3Si(OCH_3)_2$ | 0.15 | 0.3 | 0.5 | 0.5 | 2.8 |
| | | $Si(OCH_3)_4$ | 0.15 | | | | |
| | | $Al(OC_4H_9)_3$ | 0.70 | | | | |
| | 18 | $HSi(OCH_3)_3$ | 0.1 | 0.9 | 0.11 | 1.8 | 2.8 |
| | | $(CH_3)_2Si(OC_2H_5)_2$ | 0.8 | | | | |
| | | $Ta(OC_2H_5)_5$ | 0.1 | | | | |
| | 19 | $HSi(OCH_3)_3$ | 0.7 | 0.9 | 1 | 0.22 | 2.8 |
| | | $HCH_3Si(OC_2H_5)_2$ | 0.2 | | | | |
| | | $Al(OC_4H_9)_3$ | 0.05 | | | | |
| | | $Nb(OC_2H_5)_5$ | 0.05 | | | | |
| | 20 | $HSi(OC_2H_5)_3$ | 0.6 | 0.8 | 0.75 | 0.25 | 2.9 |
| | | $C_6H_5Si(OC_2H_5)_3$ | 0.2 | | | | |
| | | $Ti(OC_2H_5)_4$ | 0.2 | | | | |
| Comp. Ex. | 12 | $(CH_3)Si(OC_2H_5)_3$ | 0.8 | 0.8 | 0 | 1.0 | 3.3 |
| | | $Ti(OC_2H_5)_4$ | 0.2 | | | | |
| | 13 | $HSi(OCH_3)_3$ | 0.8 | 0.8 | 1 | 0 | 4.2 |
| | | $Al(OC_4H_9)_3$ | 0.2 | | | | |
| | 14 | $(CH_3)Si(OC_2H_5)_3$ | 0.7 | 1.0 | 0.3 | 0.7 | 3.3 |
| | | $HSi(OC_2H_5)_3$ | 0.3 | | | | |

The method of synthesizing the samples fabricated in the examples and comparative examples will now be described. First, metal alkoxides of Ti, Al, Ta and Nb were stabilized by mixture with two-fold molar amounts of ethyl acetoacetate at room temperature. Next, the Si starting materials and the stabilized metal alkoxides were placed in an ethanol solution in prescribed molar ratios and stirred with a stirrer for 30 minutes. Water was then added in an equimolar amount with respect to the total alkoxy groups, and stirring was continued for 30 minutes. In Examples 15, 16, 18, 19 and 20 and Comparative Examples 12 and 14, a 1 N aqueous hydrochloric acid solution was added instead of water prior stirring for 30 minutes. For Example 14, the prepared solution was poured into an aluminum dish and subjected to heat treatment at 70° C. for 48 hours and 150° C. for 24 hours to fabricate a sheet sample. An electrode was connected to both sides of the sheet to measure the dielectric constant with an impedance analyzer. For Examples 15–20 and Comparative Examples 12–14, each prepared solution was coated by spin coating onto an Si substrate that had been sputtered with platinum to a thickness of 1000 Å, and subjected to heat treatment with a hot plate at 150° C. for 5 minutes and a hot plate at 300° C. for 30 minutes. After the heat treatment, a round Al piece with a diameter of 1 mm and a thickness of 1000 Å was attached, and the dielectric constant was measured with an impedance analyzer.

In Example 14 there was obtained a low dielectric constant substrate with a dielectric constant of 2.5.

In Examples 15–20 there were obtained low dielectric constant thin films with dielectric constants of 2.9 or lower. In Example 15 in particular, using $HCH_3Si(OC_2H_5)$ as the main component provided a low dielectric constant of 2.4. Comparative Example 12 had only methyl groups as components other than oxygen bonded to Si, and therefore the polarization was greater and the dielectric constant was higher. Comparative Example 13 contained absolutely no methyl groups or phenyl groups in the sample, and thus it was not possible to achieve lower density by organic components, and the dielectric constant was higher. Comparative Example 14 contained only Si as the metal element, and therefore more residual SiOH groups were present, and the dielectric constant was higher.

According to the invention as described above, there may be obtained low dielectric constant materials with a relative dielectric constant of less than 3.0. Since electrical signal delay will be reduced if these low dielectric constant materials are applied as LSI interlayer insulating films and IC chips in semiconductor elements and electric circuit parts, they are suitable for achieving higher device speeds.

What we claim is:

1. A silica-based porous film-forming coating solution which includes a solution obtained by dissolving (A1) a compound represented by the general formula $R^1Si(OR)_3$ or $R^1SiX_3$ (where $R^1$ is a methyl group or phenyl group, R is an alkyl group of 1–4 carbon atoms or a phenyl group, and X is a halogen element other than F) and (B1) a compound represented by the general formula $R^2R^3Si(OR)_2$ or $R^2R^3SiX_2$ (where $R^2$ and $R^3$ each is an alkyl group of 2 or more carbon atoms or a fluoro-substituted form thereof, or a methyl group or phenyl group, provided that at least one of $R^2$ and $R^3$ is an alkyl group of 2 or more carbon atoms or a fluoro-substituted form thereof, R is an alkyl group of 1–4 carbon atoms or a phenyl group, and X is a halogen element other than F) in an organic solvent followed by hydrolysis, wherein the solute in the coating solution has a weight average molecular weight of less than 5.000.

2. A silica-based porous film-forming coating solution according to claim 1, wherein said coating solution contains a compound represented by the general formula $M(OR)_n$ or $MX_n$ (where M is at least one metal element selected from the group consisting of B, Al, Ge, Ti, Y, Zr, Nb, Ta and Si, n is the number of equivalences of the metal element, R is an alkyl group of 1–4 carbon atoms or a phenyl group, and X is a halogen element other than F), the molar ratio of M to Si is from 0.005 to 0.15, and the molar ratio of alkyl groups and/or phenyl groups to Si is from 0.6 to 15.

3. A silica-based porous film-forming coating solution which includes a solution obtained by dissolving (A1) a compound represented by the general formula $R^1Si(OR)_3$ or $R^1SiX_3$ (where $R^1$ is a methyl group or phenyl group, R is an alkyl group of 1–4 carbon atoms or a phenyl group, and X is a halogen element other than F) and (B1) a compound represented by the general formula $R^2R^3Si(OR)_2$ or $R^2R^3SiX_2$ (where $R^2$ and $R^3$ each is an alkyl group of 2 or more carbon atoms or a fluoro-substituted form thereof, or a methyl group or phenyl group, provided that at least one of $R^2$ and $R^3$ is an alkyl group of 2 or more carbon atoms or a fluoro-substituted form thereof, R is an alkyl group of 1–4 carbon atoms or a phenyl group, and X is a halogen element other than F) in an organic solvent followed by hydrolysis, wherein said coating solution contains a compound represented by the general formula $M(OR)_n$ or $MX_n$ (where M is at least one metal element selected from the group consisting of B, Al, Ge, Ti, Y, Zr, Nb, Ta and Si, n is the number of equivalences of the metal element, R is an alkyl group of 1–4 carbon atoms or a phenyl group, and X is a halogen element other than F), the molar ratio of M to Si is from 0.005 to 0.15, and the molar ratio of alkyl groups and/or phenyl groups to Si is from 0.6 to 1.5.

4. A silica-based porous film-forming coating solution according to claim 3, wherein the solute in the coating solution has a weight average molecular weight of less than 5000.

5. A process for production of a silica-based porous film which comprises:

coating a substrate with a silica-based coating solution which includes a solution obtained by dissolving (A1) a compound represented by the general formula $R^1Si(OR)_3$ or $R^1SiX_3$ (where $R^1$ is a methyl group or phenyl group, R is an alkyl group of 1–4 carbon atoms or a phenyl group, and X is a halogen element other than F) and (B1) a compound represented by the general formula $R^2R^3Si(OR)_2$ or $R^2R^3SiX_2$ (where $R^2$ and $R^3$ each is an alkyl group of 2 or more carbon atoms or a fluoro-substituted form thereof, or a methyl group or phenyl group, provided that at least one of $R^2$ and $R^3$ is an alkyl group of 2 or more carbon atoms or a fluoro-substituted form thereof, R is an alkyl group of 1–4 carbon atoms or a phenyl group, and X is a halogen element other than F), in an organic solvent followed by hydrolysis, then drying it at a temperature of from 70° C. to 300° C., heat treating it at a temperature of from 350° C. to 650° C. in an inert gas atmosphere and thermally decomposing the alkyl groups of 2 or more carbon atoms or their fluoro-substituted forms.

6. A process for production of a silica-based porous film according to claim 5, wherein said coating solution contains a compound represented by the general formula $M(OR)_n$ or $MX_n$ (where M is at least one metal element selected from the group consisting of B, Al, Ge, Ti, Y, Zr, Nb, Ta and Si, n is the number of equivalences of the metal element, R is an alkyl group of 1–4 carbon atoms or a phenyl group, and X is a halogen element other than F), the molar ratio of M to Si is from 0.005 to 0.15, and the molar ratio of alkyl groups and/or phenyl groups to Si is from 0.6 to 1.5.

7. A process according to claim 5, wherein the solute in the coating solution has a weight average molecular weight of less than 5000.

8. A process according to claim 6, wherein the solute in the coating solution has a weight average molecular weight of less than 5000.

* * * * *

UNITED STATES PATENT AND TRADEMARK OFFICE
CERTIFICATE OF CORRECTION

PATENT NO.   : 6,737,118 B2                                          Page 1 of 1
DATED        : May 18, 2004
INVENTOR(S)  : Yamada et al.

It is certified that error appears in the above-identified patent and that said Letters Patent is hereby corrected as shown below:

Column 31,
Line 65, change "5.000" to -- 5,000 --.

Signed and Sealed this

Eleventh Day of October, 2005

JON W. DUDAS
*Director of the United States Patent and Trademark Office*